US010724809B2

(12) United States Patent
Yang et al.

(10) Patent No.: US 10,724,809 B2
(45) Date of Patent: *Jul. 28, 2020

(54) RADIATIVE COOLING STRUCTURES AND SYSTEMS

(71) Applicants: THE REGENTS OF THE UNIVERSITY OF COLORADO, A BODY CORPORATE, Denver, CO (US); UNIVERSITY OF WYOMING, Laramie, WY (US)

(72) Inventors: Ronggui Yang, Boulder, CO (US); Xiaobo Yin, Boulder, CO (US); Gang Tan, Fort Collins, CO (US); Dongliang Zhao, Boulder, CO (US); Yaoguang Ma, Boulder, CO (US); Yao Zhai, Boulder, CO (US)

(73) Assignees: The Regents of the University of Colorado, a Body Corporate, Denver, CO (US); University of Wyoming, Laramie, WY (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/085,429

(22) PCT Filed: Feb. 27, 2017

(86) PCT No.: PCT/US2017/019727
§ 371 (c)(1),
(2) Date: Sep. 14, 2018

(87) PCT Pub. No.: WO2017/151514
PCT Pub. Date: Sep. 8, 2017

(65) Prior Publication Data
US 2019/0086164 A1    Mar. 21, 2019

Related U.S. Application Data

(63) Continuation-in-part of application No. 15/056,680, filed on Feb. 29, 2016, now Pat. No. 10,502,505.
(Continued)

(51) Int. Cl.
*F28F 13/18*    (2006.01)
*F25B 23/00*    (2006.01)
(Continued)

(52) U.S. Cl.
CPC ........ *F28F 13/18* (2013.01); *B32B 17/10238* (2013.01); *C08K 3/01* (2018.01);
(Continued)

(58) Field of Classification Search
None
See application file for complete search history.

(56) References Cited

U.S. PATENT DOCUMENTS 2,289,809 A    7/1942    Sherwood
3,043,112 A    7/1962    Head
(Continued)

FOREIGN PATENT DOCUMENTS

CN    101092533 A    12/2007
CN    103287014 A    9/2013
(Continued)

OTHER PUBLICATIONS

Machine translation of JP2015-193848A, published Nov. 2015. (Year: 2015).*
(Continued)

*Primary Examiner* — Monique R Jackson
(74) *Attorney, Agent, or Firm* — Leydig, Voit & Mayer, Ltd.

(57) ABSTRACT

Polymer-based selective radiative cooling structures are provided which include a selectively emissive layer of a
(Continued)

polymer or a polymer matrix composite material. Exemplary selective radiative cooling structures are in the form of a sheet, film or coating. Also provided are methods for removing heat from a body by selective thermal radiation using polymer-based selective radiative cooling structures.

27 Claims, 30 Drawing Sheets

Related U.S. Application Data

(60) Provisional application No. 62/456,540, filed on Feb. 8, 2017.

(51) Int. Cl.
| | |
|---|---|
| *B32B 17/10* | (2006.01) |
| *F24F 5/00* | (2006.01) |
| *F28D 20/00* | (2006.01) |
| *C08K 3/01* | (2018.01) |
| *C08K 3/36* | (2006.01) |

(52) U.S. Cl.
CPC ............ *F24F 5/0092* (2013.01); *F28D 20/00* (2013.01); *C08K 3/36* (2013.01); *C08K 2201/005* (2013.01); *F25B 23/003* (2013.01); *F28F 2245/06* (2013.01)

(56) References Cited

U.S. PATENT DOCUMENTS

| | | | |
|---|---|---|---|
| 3,310,102 | A | 3/1967 | Trombe |
| 3,655,426 | A | 4/1972 | Fuchs |
| 3,671,286 | A | 7/1972 | Fischell |
| 4,249,386 | A | 2/1981 | Smith et al. |
| 4,586,350 | A | 5/1986 | Berdahl |
| 5,405,680 | A | 4/1995 | Chang et al. |
| 7,503,971 | B2 | 3/2009 | Wojtyslak et al. |
| 8,911,836 | B2 | 12/2014 | Ladd |
| 2004/0185276 | A1 | 9/2004 | Hara |
| 2008/0318031 | A1 | 12/2008 | Smith |
| 2010/0155043 | A1 | 6/2010 | Smith |
| 2011/0042052 | A1 | 2/2011 | Smith et al. |
| 2013/0072617 | A1 | 3/2013 | Agari et al. |
| 2014/0131023 | A1 | 5/2014 | Raman et al. |
| 2014/0271754 | A1 | 9/2014 | Blaney et al. |
| 2015/0131023 | A1 | 5/2015 | Kim et al. |
| 2015/0131146 | A1 | 5/2015 | Fan et al. |
| 2015/0224742 | A1 | 8/2015 | Inoue et al. |
| 2015/0338175 | A1 | 11/2015 | Raman et al. |
| 2016/0122479 | A1 | 5/2016 | Kozyuk |
| 2016/0326351 | A1 | 11/2016 | Yalcin et al. |
| 2016/0356561 | A1 | 12/2016 | Heltzel |
| 2017/0248381 | A1 | 8/2017 | Yang et al. |
| 2018/0180331 | A1 | 6/2018 | Yu et al. |

FOREIGN PATENT DOCUMENTS

| | | | |
|---|---|---|---|
| DE | 19849330 | A1 | 4/2000 |
| FR | 2917417 | A1 | 12/2008 |
| GB | 1122416 | | 8/1968 |
| JP | S6086173 | A | 5/1985 |
| JP | 2010000460 | A | 1/2010 |
| JP | 2015193848 | A * | 11/2015 |
| WO | WO 2008/154692 | A1 | 12/2008 |
| WO | WO 2009/112495 | A1 | 9/2009 |
| WO | WO 2010/033082 | | 3/2010 |
| WO | WO 2015/073714 | A1 | 5/2015 |
| WO | WO 2015/103096 | A1 | 7/2015 |
| WO | WO 2016/205717 | A1 | 12/2016 |

OTHER PUBLICATIONS

U.S. Appl. No. 15/056,680, filed Feb. 29, 2016.
Aili et al. (publicly available Mar. 2019) "A kW-scale, 24-hour continuously operational, radiative sky cooling system: Experimental demonstration and predictive modeling," Energy Conversion and Management 186: 586-596 (published Apr. 2019).
Aili et al. (publicly available Jul. 2019) "Selection of polymers with functional groups for daytime radiative cooling," Materials Today Physics 10: 1-5 (published Aug. 2019).
Brady et al. (1992) "Principles and formulations for organic coatings with tailored infrared properties," Progress in Organic Coatings 20: 1-25.
Corbitt et al. (2015) "Implementation of optical dielectric metamaterials: A review," Journal of Quantitative Spectroscopy & Radiative Transfer 158: 3-16.
Fang et al. (publicly available May 2019) "Performance evaluation of a metamaterial-based new cool roof using improved Roof Thermal Transfer Value model," Applied Energy 248: 589-599 (published Aug. 2019).
Hossain et al. (Feb. 2016) "Radiative Cooling: Principles, Progress, and Potentials," Advanced Science 3: 1-10.
Raman et al. (2014) "Passive radiative cooling below ambient air temperature under direct sunlight," Nature 515: 540-544 (11 pp.).
Tesh (Feb. 2017) "New metamaterial enhances natural cooling without power input," Physics World, 3 pp.
Wogan (Feb. 2017) "Film printed by the metre can cool homes without any power," Chemistry World, Science/AAAS, 3 pp.
Yang et al. (Feb. 2016) "Radiative Cooled-Cold Storage Modules and System (RadiCold)," Poster Presentation at the 2016 ARPA-E Energy Innovation Summit, Feb. 29-Mar. 2, 2016, Washington, D.C., 1 pp.
Yang et al. (Aug. 2019) "Passive cooling in an urban setting," Nature Sustainability 2: 663-664.
Zhai et al. (Mar. 2017) "Scalable-manufactured randomized glass-polymer hybrid metamaterial for daytime radiative cooling," Science 355: 1062-1066.
Zhang (Mar. 2017) "Metamaterials for perpetual cooling at large scales," Science 355: 1023-1024.
Zhang et al. (publicly available May 2018) "Energy saving and economic analysis of a new hybrid radiative cooling system for single-family houses in the USA," Applied Energy 224: 371-381 (published Aug. 2018).
Zhao et al. (Jan. 2019) "Subambient Cooling of Water: Toward Real-World Applications of Daytime Radiative Cooling," Joule 3: 111-123.
AkzoNobel, Product Specification for Expancel Microspheres, May 2017.
EPO Machine translation of CN101092533A published Dec. 2007.
EPO Machine translation of DE19849330A1 published Apr. 2000.
EPO Machine translation of FR2917417A1 published Dec. 2008.
Gentle et al., "A Subambient Open Roof Surface under the Mid-Summer Sun," Advanced Science 2015, 2, 4 pp.
International Search Report and Written Opinion corresponding to International Patent Application No. PCT/US17/19727, dated Jun. 27, 2017.
Machine translation of JP2010-000460A, published Jan. 7, 2010.
Nilsson et al., "A solar reflecting material for radiative cooling applications: ZnS pigmented polyethylene," Proceedings of SPIE—The International Society for Optical Engineering, Nov. 1992, 14 pp.
Rephaeli et al., (Mar. 5, 2013), "Ultrabroadband photonic structures to achieve high-performance daytime radiative cooling," Nano letters. 13(4):1457-1461.
TPX Brochure, Mitsui Chemical, Inc., Sep. 2011, 6 pp.
Extended European Search Report, dated Feb. 19, 2020, corresponding to European Patent Application No. 17760553.2, 19 pp.

* cited by examiner

FIG. 8A
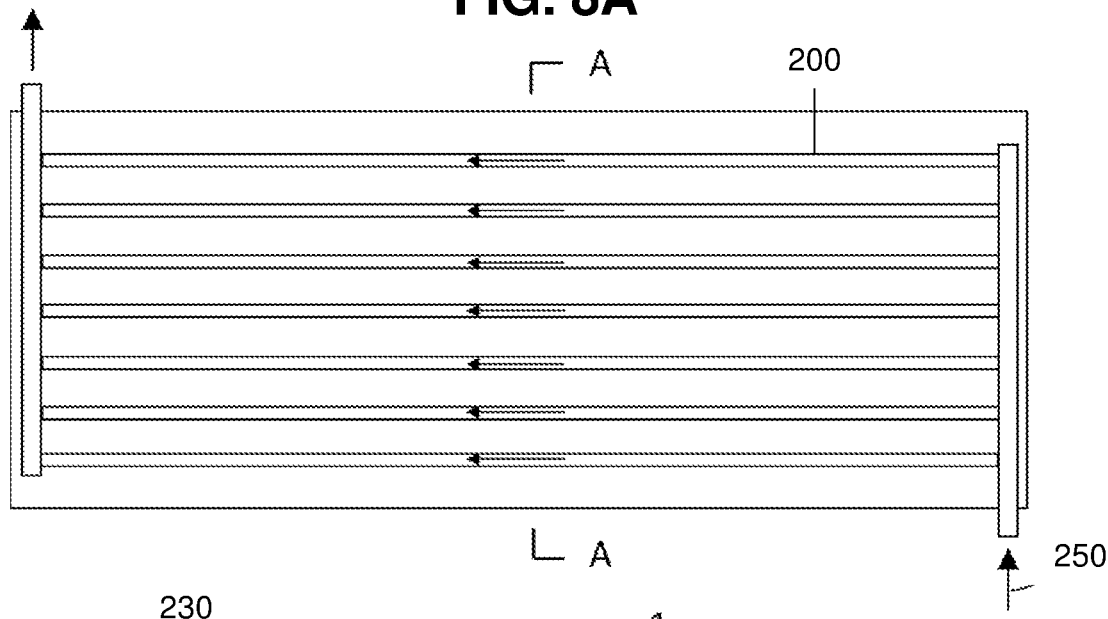
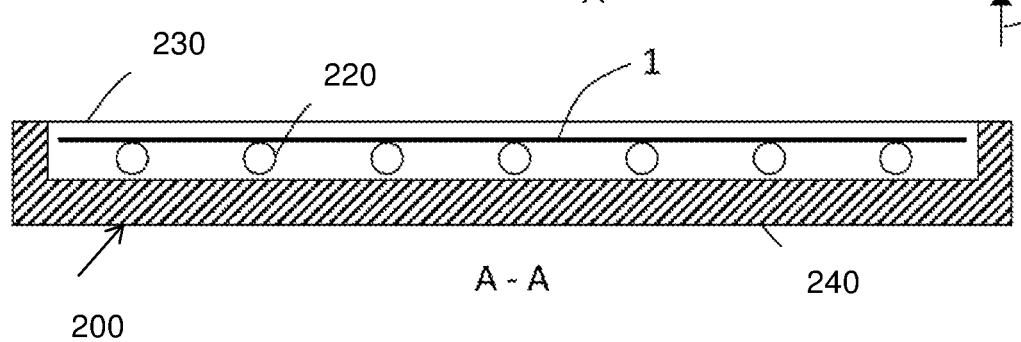
FIG. 8B wavelength (μm)

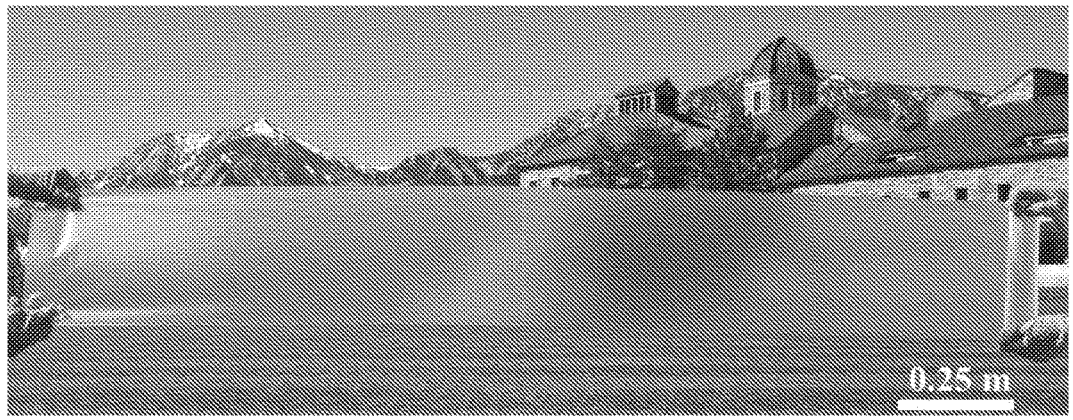
FIG. 18A
FIG. 18B
FIG. 18C
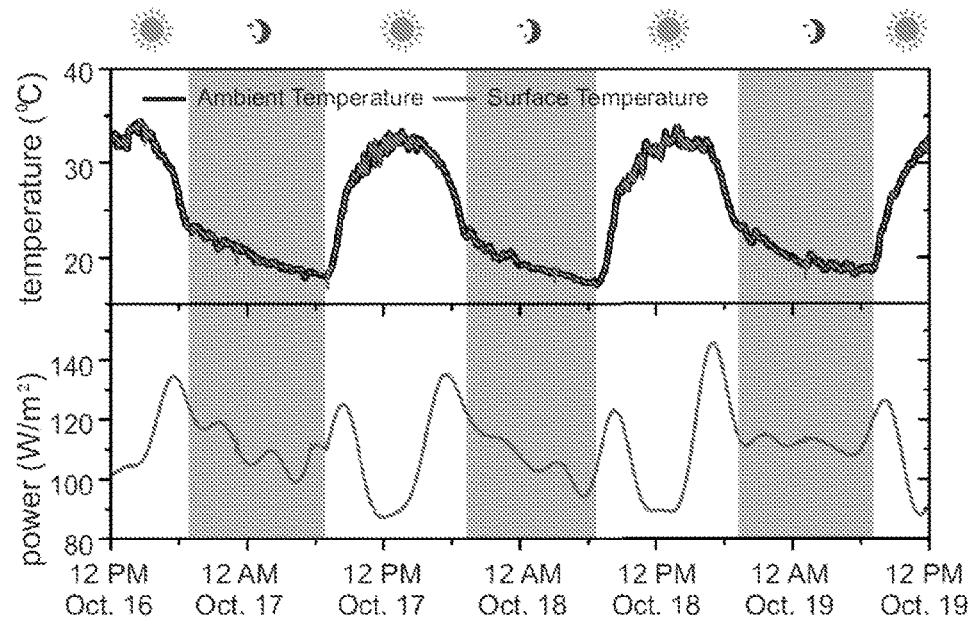

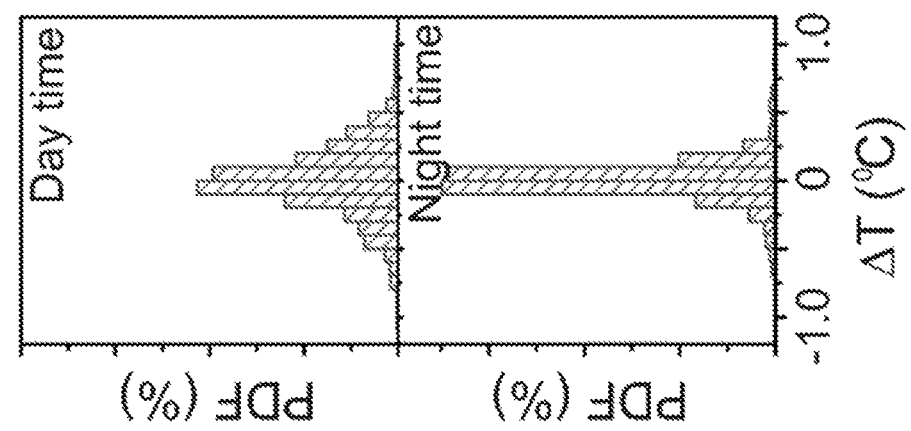
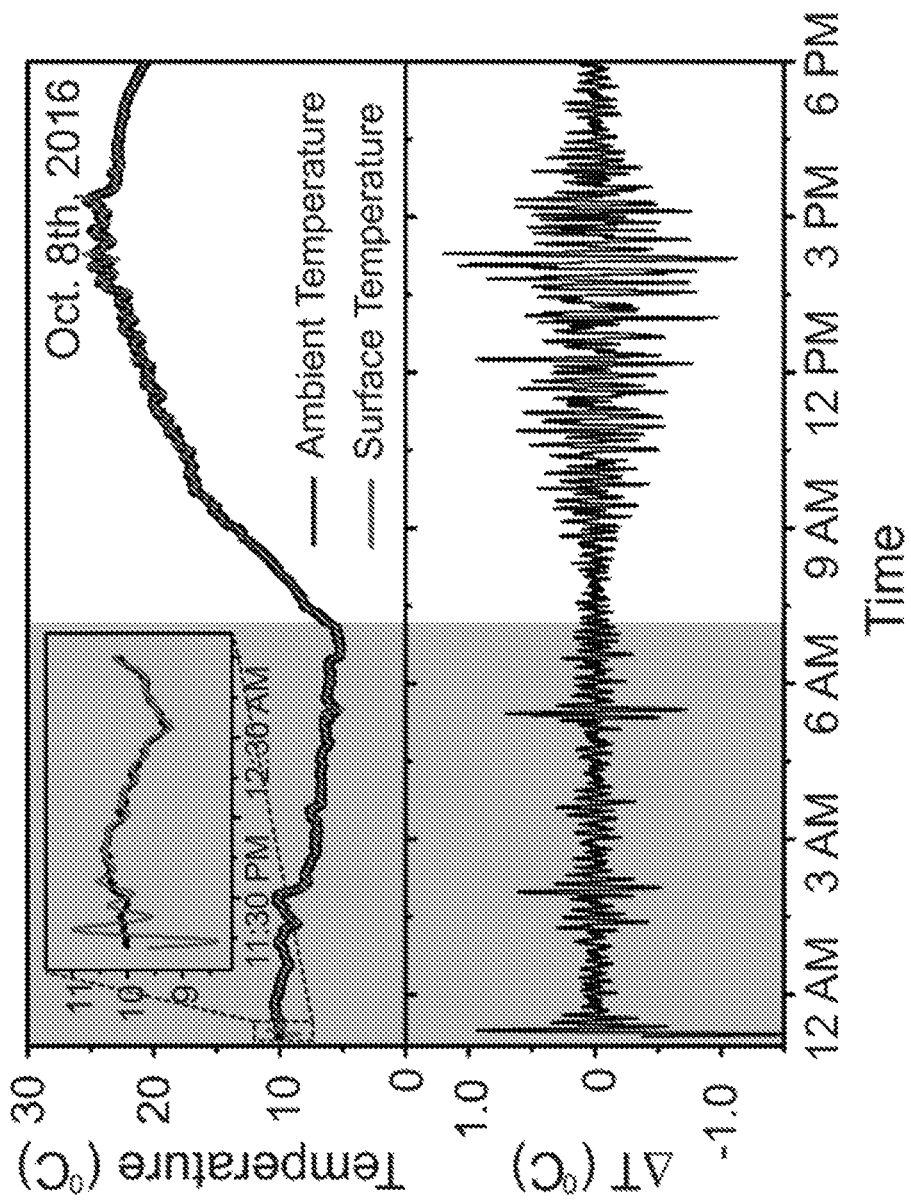
FIG. 22A
FIG. 22B
FIG. 22C
FIG. 22D

RADIATIVE COOLING STRUCTURES AND SYSTEMS

CROSS-REFERENCE TO RELATED APPLICATIONS

This application is a U.S. National Stage Application under 35 U.S.C. § 371 of International Application No. PCT/US2017/019727, filed Feb. 27, 2017, which claims the benefit of U.S. Provisional Patent Application No. 62/456,540 filed Feb. 8, 2017 and U.S. application Ser. No. 15/056,680 filed Feb. 29, 2016, each of which is hereby incorporated by reference to the extent not inconsistent herewith.

STATEMENT REGARDING FEDERALLY SPONSORED RESEARCH OR DEVELOPMENT

This invention was made with government support under grant number DE-AR0000580 awarded by the Department of Energy's Advanced Research Projects Agency-Energy (ARPA-E). The government has certain rights in the invention.

BACKGROUND OF THE INVENTION

Radiative cooling features the release of heat from an object or surface in the form of thermal radiation, thereby lowering the temperature of the object or surface, or maintaining its temperature at a relatively lower baseline when operating in steady state. The thermal radiation emitted from a non-zero-temperature surface (in Kelvin) has a continuous wavelength or frequency spectrum that depends on the temperature of the surface; most of the thermal radiation emitted by objects near room temperature is in the infrared region(s) of the electromagnetic spectrum.

A wavelength-selective radiative cooling device can emit thermal radiation preferentially in the selected wavelength ranges of the electromagnetic spectrum. For example, a selective radiative cooling device may preferentially emit infrared radiation at wavelengths corresponding to a "atmosphere window", also known as an "atmospheric transmission window" or an "atmospheric transparent window". The Earth's atmosphere is practically non-absorbing in these "window" wavelength ranges, such as at 7-13 µm and 16-30 µm. Examples of radiative cooling devices for emission of infrared radiation are described in U.S. Pat. Nos. 2,289,809; 3,043,112; 3,671,286; 4,586,350; and 7,503,971 and U.S. Patent Application Publications US2010/0155043 and US2015/0131023.

BRIEF SUMMARY OF THE INVENTION

In some aspects, the present disclosure relates to polymer-based selective radiative cooling structures which include a wavelength-selective emissive layer of a polymer or a polymer matrix composite material. Exemplary wavelength-selective radiative cooling structures are in the form of a sheet, film or coating and can be viewed as providing a radiative cooling surface. The polymer-based radiative cooling structures can be used during the day or night. In additional aspects, the disclosure relates to methods for removing heat from a body by selective radiation using polymer-based wavelength-selective radiative cooling structures. Additionally, the disclosure pertains to manufacturing methods for polymer-based radiative cooling structures. The polymer-based solutions for radiative cooling described herein can be lower cost, more effective and/or more easily produced and integrated at application size scales than inorganic multilayer optical coatings.

In some embodiments, the wavelength-selective radiative cooling structures limit absorption of solar energy. FIG. 1 illustrates and compares the solar spectrum (AM1.5) and the thermal radiation spectrum for a blackbody at 15° C. through the atmospheric transmission windows. There is a large power density mismatch between the two spectra with relatively large heating power coming from the solar spectrum versus the potential self-cooling by thermal radiation through the atmospheric transmission window. In further embodiments, the selective radiative cooling structures maximize the infrared radiation in one or more atmospheric transmission windows.

In embodiments, the selective radiative cooling structures described herein provide radiative cooling powers greater than 100 W/m² during the daytime, nighttime, or both at room temperature. Embodiments can also be selected such that the cooling power at room temperature is in the 50 to 150 W/m², 20 to 40 W/m², 40 to 60 W/m², 60 to 80 W/m², 80 to 100 W/m², 100 to 120 W/m², 120 to 140 W/m², or 140 to 160 W/m² range during the daytime, nighttime, or both. In embodiments, the cooling power is measured at a temperature selected from the range of −100° C. to 500° C. In an example, the cooling power is measured for a temperature of 15° C. In an example, the solar radiative heat flux is measured with an equivalent of 890 W/m² of direct sunlight incident on the radiative cooling structure. However, in embodiments the radiative cooling structure reflects most of the sunlight due to its wavelength-selective characteristics which results in a net cooling of 100 W/m². Elements of the above embodiments can be selected appropriately to tune the cooling power to the desired range for objects of different core temperatures to be cooled. The radiative cooling power is higher at higher surface temperatures. For example, the cooling power can be more than 200 W/m² for surface temperature of 50° C. Some embodiments can operate at temperatures greater than 300° C. The weather conditions such as wind, condensate, and clouds may also effect the cooling power.

In an aspect of the present disclosure, the wavelength-selective radiative cooling structures transmit (or reflect) solar radiation, emit infrared radiation through the atmospheric transmission window and comprise a selectively emissive layer. In embodiments, the selectively emissive layer of the wavelength-selective radiative cooling structure also transmits solar radiation and emits infrared radiation. Such radiative cooling structures can be applied for cooling of solar cells, windows, roofs, ceilings and other objects by placing the selective radiative cooling structure in thermal communication with the body to be cooled. The windows, roofs, and ceilings can be part of transportation systems, such as automobiles, or building structures, such as houses, and greenhouses. The radiative cooling structures can also be applied on heat exchange systems by placing the wavelength-selective radiative cooling structure in thermal communication with heat exchanging media such as fluids or a heat exchanger.

In some embodiments, the wavelength-selective radiative cooling structure is characterized by an average emissivity ranging from 0.5 to 1 over one or more atmospheric transmission windows. As examples, the average emissivity ranges from 0.5 to 1 over the wavelength range 7 µm to 14 µm, the wavelength range 7 µm to 13 µm, the wavelength range 16 µm to 30 µm or a combination thereof. In additional embodiments, narrower wavelength ranges are applied, such as from 8 µm to 12 µm or from 17 µm to 25 µm. As additional examples, the emissivity ranges from 0.6 to 1.0, 0.7 to 1.0, 0.8 to 1, 0.9 to 1, 0.95 to 1 or greater than 0.95 to 1 over the selected wavelength range. In an embodiment, the average emissivity is a hemispherical emissivity averaged over the wavelength range of interest.

In additional embodiments, the wavelength-selective radiative cooling structure is characterized by a low average absorptivity ranging from 0 to 0.2 over a selected wavelength range of the solar spectrum. As additional examples, the absorptivity ranges from 0.15 to 0, 0.1 to 0, 0.05 to 0 or less than 0.05 over the selected wavelength range. FIG. 1 illustrates irradiance as a function of wavelength for the AM1.5 solar irradiance. In embodiments, the absorptivity is averaged over the solar spectrum with wavelength ranging from 0.3 µm to 5 µm or 0.3 µm to 3 µm.

In embodiments, the selectively emissive layer comprises a polymer layer or a polymer composite layer which transmits solar radiation and emits infrared radiation. In embodiments, the polymer layer has low solar absorption, for example, absorption of solar energy in the 300 nm to 5000 nm range less than 20%, less than or equal to 15%, less than or equal to 10% or less than or equal to 5% on average with the lower bound being 0. In further embodiments, the layer may transmit more than 80%, greater than or equal to 85%, greater than or equal to 90% or greater than or equal to 95% of incident solar light, with the upper bound being 100%. In further embodiments, the polymer layer has a high infrared absorptivity (emissivity) in the range 5 µm to 50 µm, such as 0.6 to 1, 0.7 to 1, 0.8 to 1, 0.9 to 1, 0.95 to 1 or greater than 0.95 to 1. In embodiments, the polymer has one or more absorption bands in an atmospheric window and does not show significant solar absorption from 0.3 to 3 µm. Suitable polymers include, but are not limited to polyolefins, polymethyl methacrylate (PMMA), polymethylpentene (PMP, also known as 4-methylpentene-1 and poly(4-methyl-1-pentene)), polyethylene (PE), polystyrene (PS), polyethylene terephthalate (PET), polycarbonate (PC), Polytetrafluoroethylene (PTFE), combinations thereof and copolymers thereof. Polymethylpentene is commercially available as TPX™ (Mitsui Chemicals). The basic monomer for TPX™ is poly(4-methyl-1 pentene), but TPX™ includes copolymers of poly(4-methyl-1 pentene) with α-olefins such as 1-pentene, 1-hexene and 1-octene(Fink, J., Handbook of Engineering and Specialty Thermoplastics, Polyolefins and Styrenics, 2010, Scrivener, pp 109-111).

FIG. 2 shows a schematic drawing of an emissive layer 5 which is a sheet of polymer 20. In embodiments, the thickness of the polymer sheet or polymer-based layer can be 5 µm to 3 or more millimeters, from 5 µm to 1 mm, from 5 µm to 500 µm, from 5 µm to 100 µm, from 10 µm to 3 mm, from 100 µm to from 750 µm, from 100 µm to 1000 µm, from 200 µm to 750 µm, from 250 µm to 500 µm or from 500 µm to 1000 µm. In embodiments, the selective radiative cooling structure comprises a selectively emissive layer comprising a polymer wherein the selective radiative cooling structure is characterized by an average emissivity ranging from 0.6 to 1.0 over the wavelength range 7 µm to 14 µm.

In additional embodiments, the selectively emissive layer comprises a layer of a composite material comprising a polymer matrix and a plurality of filler regions (e.g. particles) distributed in the matrix. In embodiments, the polymer transmits solar radiation and emits infrared radiation; exemplary polymers are described above. In embodiments, the polymer has one or more absorption bands in an atmospheric transmission window and does not show significant absorption in the solar spectrum from 0.3 to 3 µm. In some examples the filler regions are also polymeric, but of a different polymer than the polymer matrix (e.g. the matrix is of a first polymer and the filler is of a second polymer). In other examples the filler regions are non-polymeric such as a non-polymeric dielectric material. In further embodiments, the non-polymer regions (fillers) can be tailored to decrease solar absorption, increase thermal emission, or otherwise increase the efficiency of radiative cooling for the desired application. In an embodiment, the non-polymer regions enhance the radiative cooling performance of the polymer sheet by increasing infrared emissivity, such as via Mie scattering effects and added absorption resonances. In embodiments, the non-polymer material has one or more absorption bands in an atmospheric window and does not show significant absorption in the solar spectrum from 0.3 to 3 µm. Increased efficiency in these embodiments may allow the polymer-based composite sheets to be higher performing or relatively thinner at the same performance level, compared to an all-polymer counterpart.

In an embodiment, the refractive index of the non-polymeric regions is matched or substantially matched to the refractive index of the polymer at visible wavelengths. Such embodiments include applications where it is preferable that the selectively emissive layer is transparent rather than translucent. Such applications include attaching the selectively emissive layer to a window (e.g., of a building or vehicles), or to an electronic visual display (e.g., a mobile device). Substantially matched refractive indices differ by less than $\Delta n=0.05$, for example, or optionally, less than $\Delta n=0.1$ or less than $\Delta n=0.01$. The selectively emissive layer may be sufficiently transparent such that its haze value, as defined by ASTM Standard D-1003, is less or equal to fifteen percent, ten percent, five percent, or one percent, for example.

In an embodiment, the refractive index of the non-polymeric regions is mismatched to the refractive index of the polymer at visible wavelength. Such embodiments include applications where it is preferable that the selectively emissive layer is translucent rather than transparent. Such applications include attaching the selectively emissive layer to a privacy window, or to a solar panel.

In the selectively emissive layer, the non-polymeric region may be $SiO_2$ and the polymeric region may be polyethylene terephthalate (PET). At a free-space wavelength of 9.8 µm, the refractive indices of $SiO_2$ and PET are 2.9 and 1.7±0.1 respectively, such that the refractive index mismatch $\Delta n$ is 1.2±0.1. The selectively emissive layer may be sufficiently translucent such that its haze value exceeds ten percent, twenty percent, or forty percent, for example.

In an embodiment, the emissive layer comprises a polymer layer with some volumetric fraction of embedded particles or spheres, as illustrated schematically in FIG. 3A. FIG. 3B shows an exemplary absorption curve (<5% average absorption in solar spectrum) of a polymer layer with embedded non-polymer particles of an embodiment of the present invention (50-µm-thick polymethylpentene film with 5 vol % 8-µm-diameter solid silica microspheres). In embodiments, the dielectric particles are spherical, ellipsoidal, polyhedral, rod-shaped, plate-shaped or irregular in shape. In embodiments, the particles or spheres are from 1 µm to 20 µm in diameter (or effective diameter or characteristic dimension if the particles are non-spherical), 3 µm to 30 µm, 4 µm to 10 µm or from 20 µm to 30 µm. As examples, the diameter or thickness of rod-shaped or plate-shaped particles can be used as the characteristic dimension. In further embodiments, the average or mean size of the particles or spheres falls within the specified range. In further embodiments, the emissive layer may comprise particles with two or more distinct size ranges. In embodiments, the particles or spheres are of a dielectric material. Suitable materials for the particles or spheres include, but are not limited to silica ($SiO_2$), $CaCO_3$, SiC, any type of glass-like materials, and combinations thereof. In some cases, polymer compositions without dispersed particles can be used. In embodiments, the volumetric concentration of the particles or spheres may be 1% to 15%, 5 to 15%, 1% to 25%, 2% to 25% or 5 to 25%. In embodiments, the concentration can be zero (pure polymer film). In embodiments, the polymer matrix of the composite material forms the balance of the composite volume or ranges from 80 to 100% or 95-100% of the composite. In an embodiment, the thickness of the polymer layer is thicker than the effective diameter of the particles or spheres. In embodiments, the polymer or polymer-based layer can be 10 μm to 3 or more millimeters in thickness, from 4 μm to 10 μm, from 10 μm to 1 mm, from 10 μm to 500 μm, from 10 μm to 100 μm, from 100 μm to 750 μm, from 200 μm to 1000 μm, from 200 μm to 750 μm, from 250 μm to 500 μm or from 500 μm to 1000 μm.

In an embodiment, the disclosure provides a wavelength-selective radiative cooling structure, the structure comprising a selectively emissive layer comprising a polymer and a plurality of dielectric particles dispersed in the polymer, the volume percentage of the dielectric particles ranging from 2% to 25% and the particles being characterized by an average size ranging from 3 μm to 30 μm wherein the polymer, the plurality of dielectric particles, or the combination are characterized by having one or more absorption bands in an atmospheric transparent window and being transparent to solar radiation from 0.3 to 3 μm. As an example, the wavelength-selective radiative cooling structure is characterized by a solar absorptivity from 0 to 0.1 and an average emissivity ranging from 0.6 to 1.0 over the atmospheric transparent window. In embodiments, the polymer is selected from the group consisting of: 4-methyl-1-pentene polymer, a 4-methyl-1-pentene copolymer, polyvinyl fluoride, polyethylene terephthalate and TPX™. As an additional example, the particles are silica microspheres or micro rods. In an embodiment, for example, the dielectric particles are selected from the group consisting of: silicon dioxide ($SiO_2$), calcium carbonate ($CaCO_3$), silicon carbide (SiC), zinc oxide (ZnO), titanium dioxide ($TiO_2$) and alumina ($Al_2O_3$).

In an embodiment, for example, provided is a selective radiative cooling structure, the structure comprising: a selectively emissive layer comprising a polymer and a plurality of dielectric particles dispersed in the polymer, the volume percentage of the dielectric particles in the selectively emissive layer ranging from 5% to 10% and the particles characterized by an average size ranging from 3 μm to 30 μm; wherein the selective radiative cooling structure is characterized by an average emissivity ranging from 0.5 to 1.0 over the wavelength range 7 μm to 14 μm, wherein the polymer is polyethylene terephthalate and the dielectric particles comprise $SiO_2$.

In an embodiment, the disclosure provides a selective radiative cooling structure, the structure comprising:

a selectively emissive layer comprising a polymer and a plurality of dielectric particles dispersed in the polymer, the volume percentage of the dielectric particles in the selectively emissive layer ranging from 1% to 25% and the particles characterized by an average size ranging from 3 μm to 15 μm, wherein the selective radiative cooling structure is characterized by an average emissivity ranging from 0.5 to 1.0 over the wavelength range 7 μm to 14 μm.

In an embodiment, the disclosure provides a selective radiative cooling structure, the structure comprising a selectively emissive layer comprising a polymer and a plurality of dielectric particles dispersed in the polymer, the volume percentage of the dielectric particles in the selectively emissive layer ranging from 1% to 25% or 2% to 25% or 1% to 15% and the particles being characterized by an average size ranging from 1 μm to 20 μm or from 3 μm to 30 μm wherein the selective radiative cooling structure is characterized by an average emissivity ranging from 0.6 to 1.0 over the wavelength range 7 μm to 13 μm. In further embodiments, the selective radiative cooling structure is characterized by an average absorptivity from 0 to 0.1 or 0 to 0.2 over the wavelength range 0.3 μm to 3 μm. In additional embodiments, the selective radiative cooling structure is in sheet or film form. For example, the sheet may have a width or length on the scale of centimeters or meters. Sheets or film beneficially may be manufactured in a roll to roll process. In other embodiments, the radiative cooling structure is applied to a surface, for example, as a paint or a spray.

In additional embodiments, one or more additional sheets or layers of material are coupled to the polymer-based radiative cooling sheet. In embodiments, the additional layer(s) have anti-reflection, water-proofing, weather-resisting, UV-light protection, wear-resistant or similar properties. Materials that may compose or be included in these sheets include materials or polymers that solar transparent and weather-resistant, such as PET, or a dielectric material, such as $MgF_2$, and combinations thereof. In some examples, at least one of these additional layers is infrared absorbing while in other examples at least one of these additional layers is transparent to infrared light. Combinations include multi-layered structures of polymer and dielectric materials that are transparent to infrared light. In some embodiments, the thickness of a layer that protects from UV-light exposure and/or weather is from 10 nm to 10 μm, 100 nm to 10 μm, from 10 nm to 1 μm, from 100 nm to 1 μm or from 500 nm to 10 μm.

In further aspects, the present disclosure provides selective radiative cooling structures which reflect solar radiation and emit infrared radiation and comprise a selectively emissive layer. In embodiments, the wavelength-selective radiative cooling structure further comprises a reflective layer in contact with the selectively emissive layer. In further embodiments, the reflective layer is reflective for solar radiation. As previously described, the selective emissive comprises a polymer and in some examples further comprises filler particles.

In embodiments, the disclosure provides a selective radiative cooling structure comprising a selectively emissive layer and solar-reflective layer in contact with the selectively emissive layer wherein the selective radiative cooling structure is characterized by a solar reflectivity ranging from 0.9 to 1. For example, the solar reflectivity is measured over the wavelength range 0.3 μm to 3 μm. In embodiments, the solar-reflective layer comprises a metal film or a metal substrate. For example, the selectively emissive layer is laid on a solar-reflective metal substrate which is a structural element of the body to be cooled. As examples, the metal film is characterized by an average thickness from 30 nanometers to 1000 nanometers and the metal substrate is characterized by an average thickness from 1000 nanometers to 10 cm. In embodiments, the selectively emissive layer is characterized by a solar transmissivity ranging from 0.7 to 1. As previously described, the wavelength selective structure comprises a polymer and in some examples further comprises filler particles.

In an embodiment, the disclosure provides a selective radiative cooling structure comprising:
   a selectively emissive layer comprising a polymer and a plurality of dielectric particles dispersed in the polymer, the volume percentage of the dielectric particles in the selectively emissive layer ranging from 1% to 25% and the particles characterized by an average size ranging from 3 μm to 30 μm, and
   a solar reflective layer in contact with the selectively emissive layer, the solar reflecting layer comprising a metal film or metal substrate,
   wherein the selective radiative cooling structure is characterized by an average emissivity ranging from 0.5 to 1.0 over the wavelength range 7 μm to 14 μm, and the selective radiative cooling structure is characterized by a solar reflectivity ranging from 0.8 to 1 over the wavelength range 0.3 μm to 3 μm.

FIG. 4A schematically illustrates a single reflective layer 40 in contact with a selectively emissive layer 5 which includes non-polymer particles 30 in a matrix of polymer 20. For example, this reflective layer is metallic or of any other solar reflective material. In embodiments, the metallic reflective layer includes silver, aluminum, gold, or copper. In embodiments, the layer is from 20 nm to 300 nm or from 100 nm to 1 μm. These embodiments may be particularly suitable for any applications wherein the object targeted for cooling benefits from reduced absorption of incident solar radiation.

Additional embodiments of the present disclosure include one or more additional layers of material coupled to the selectively emissive layer and/or reflective layer. As examples, an anti-reflection layer, a protection layer or a combination thereof is coupled to one side of the emissive layer while a reflective layer or a combination of a barrier layer and a reflective layer is coupled to the other side of the emissive layer. Exemplary embodiments are shown in FIG. 4B through 4E. FIG. 4B illustrates an anti-reflection layer 50 in contact with the selectively emissive layer 5, with a protection layer 60 in contact with the anti-reflection layer. As shown in FIG. 4C a barrier layer, a layer between the selectively emissive layer 5 and the reflective layer 40 is included in some embodiments; the embodiment of FIG. 4C also includes a protection layer 60 in contact with the selectively emissive layer 5. Suitable materials for the barrier layer include, but are not limited to, a dielectric materials or a solar transparent material. Suitable dielectric materials include, but are not limited to metal or semiconductor oxide materials such as $TiO_2$, $SiO_2$ and $Al_2O_3$. For example, the barrier layer is from 5 nm to 100 nm. In embodiments, a barrier layer protects the reflective layer from corrosion due to gas or water molecule penetration (e.g. from the top polymer layers) and/or improves the metal adhesion. FIG. 4D shows an additional embodiment, wherein a copper or otherwise thermally conductive material layer contacts the reflective layer; the layer of thermally conductive material is included for enhanced thermal coupling to the object targeted for cooling. The reflective layer may be any conductive material including metals, stacked layers of metals, dielectric, etc. FIG. 4E shows an embodiment with a protection layer 60 and a barrier layer 70 in contact with the selectively emissive layer 5. An anti-reflective layer 50 is in contact with the protection layer 60 and a metal reflective layer 40 is in contact with the barrier layer 70.

These embodiments may be particularly suitable for any applications wherein the object targeted for cooling benefits from reduced absorption of incident solar radiation. In embodiments, the additional layer(s) have anti-reflection, water-proofing, weather-resisting, UV-light protection, wear-resisting or similar properties. Materials that may compose or be included in these sheets include solar transparent, weather-resistant materials, such as PET, or a dielectric material, such as $MgF_2$, and combinations thereof. Combinations include multi-layered structures of polymer and dielectric materials.

These layers can be present in addition to the reflective layer (see for example FIGS. 4B, 4C, 4D and 4E). In embodiments with a reflective layer, the additional layer or layers may be on the opposite side of the polymer layer from the reflective layer. Materials that may compose or be included in these sheets include any solar transparent and weather-resistant materials, such as PET, or dielectric material, such as $MgF_2$, or multiple-layered structure of these polymer and dielectric materials.

The present disclosure further relates to methods for removing heat from a body by selective thermal radiation using polymer-based selective radiative cooling structures. In some embodiments, the polymer-based selective radiative cooling structure does not include a reflective layer and the selectively emissive layer is in thermal communication with a body to be cooled. As examples, the selectively emissive layer is placed in direct contact with the body or may be attached with an adhesive.

In some embodiments, the disclosure provides methods for removing heat from a body by selective thermal radiation, the methods comprising the steps of:
   a. placing a selective radiative cooling structure in thermal communication with a surface of the body, the selective radiative cooling structure comprising a selectively emissive layer comprising a polymer, wherein the selectively emissive layer is in thermal communication with the body and the selective radiative cooling structure is characterized by an average emissivity ranging from 0.6 to 1.0 over the wavelength range 7 μm to 14 μm;
   b. transferring heat from the body to the selective radiative cooling structure; and
   c. radiating heat from the selectively emissive layer of the selective radiative cooling structure.

In an example, the selective radiative cooling structure is characterized by a solar absorptivity from 0 to 0.2 over the wavelength of 0.3 μm to 3 μm. In some embodiments, the selectively emissive layer further comprises a plurality of dielectric particles dispersed in the polymer as described herein. For example, the volume percentage of the dielectric particles in the selectively emissive layer ranges from 2% to 25% and the particles are characterized by an average size ranging from 3 μm to 30 μm. As examples, the body is a solar panel, the roof or window of an automobile, the roof or window of a building, or a cold storage structure for energy, food, oil or other commodities.

In additional embodiments, the disclosure provides methods for removing heat from a body by selective thermal radiation, the methods comprising the steps of:
   a. placing a selective radiative cooling structure in thermal communication with a surface of the body, the selective radiative cooling structure comprising a selectively emissive layer comprising a polymer and the selectively emissive layer wherein the selective radiative cooling structure are characterized by a solar absorptivity from 0 to 0.2 over the wavelength of 0.3 µm to 3 µm and an average emissivity ranging from 0.5 to 1.0 over the wavelength range 7 µm to 14 µm;
b. transferring heat from the body to the selective radiative cooling structure; and
c. radiating heat from the selectively emissive layer of the selective radiative cooling structure.

In examples, the selectively emissive layer is in thermal communication with the body by directly contacting the body or by being attached to the body by an adhesive layer. In some embodiments, the selectively emissive layer further comprises a plurality of dielectric particles dispersed in the polymer as described herein.

In some embodiments, a solar transparent and infrared emissive selective radiative cooler can be employed to cool down a solar cell. The polymer-based radiative cooler sheet is directly attached to the top of solar cell as shown in FIG. 5. It does not affect solar cell performance since it is transparent for solar incidence. However, solar cell temperature is reduced due to the polymer sheet's infrared emissive effect to the low-temperature sky, which results in increasing the efficiency and the reliability of solar cells. In FIG. 5, labels are as follows: 100 solar cell; 1 radiative cooling sheet; 3 solar incidence radiation; 4 radiative cooling flux from infrared-emissive radiative cooling sheet to the sky.

In other embodiments, a solar transparent and infrared emissive selective radiative cooler can be attached to a radiant ceiling panel surface. The amount of thermal energy that is transferred from the room via thermal radiation is dependent on the emissivity of the radiant ceiling panel surface. A conventional radiant ceiling panel surface usually has an emissivity of 0.9-0.95. When a selective radiative cooling structure having an emissivity greater than or equal to 0.95 is attached to a conventional radiant ceiling panel surface (see FIG. 6), it is capable of providing higher radiative cooling efficiency between the radiant ceiling panel and room. FIG. 6: 150 building; 320 cold storage tank; 1 radiative cooling sheet attached to radiant ceiling; 6 building internal heat gain; 7 radiative flux from room to radiant ceiling; 8 convective heat transfer from room air to radiant ceiling.

The present disclosure further relates to methods for removing heat from a body by selective thermal radiation using polymer-based wavelength-selective radiative cooling structures including a reflective layer. As examples, the reflective layer is attached to the body with an adhesive or is attached to a thermally conductive layer which is then attached to the body.

In additional embodiments, the disclosure provides methods for removing heat from a body by selective thermal radiation, the methods comprising the steps of:
a. placing a selective radiative cooling structure in thermal communication with a surface of the body, the wavelength-selective radiative cooling structure comprising a selectively emissive layer comprising a polymer and a solar-reflective layer in contact with the wavelength-selective emissive layer, wherein the selectively emissive layer is in thermal communication with the body and the selective radiative cooling structure is characterized by an average emissivity ranging from 0.6 to 1.0 over the wavelength range 7 µm to 13 µm;
b. transferring heat from the body to the selective radiative cooling structure; and
c. radiating heat from selectively emissive layer of the selective radiative cooling structure.

As previously described the solar reflective layer in examples is a metal film or a metal substrate. Further, in some embodiments, the selectively emissive layer further comprises a plurality of dielectric particles dispersed in the polymer as described herein. For example, the volume percentage of the dielectric particles in the selectively emissive layer ranges from 2% to 25% and the particles are characterized by an average size ranging from 3 µm to 30 µm. As examples, the body is a portion of a building or the roof of a structure. As additional examples, the body is a cold collection device such as a passive thermosiphon or an active channel array and wherein a heat transfer fluid circulates inside the body.

In an embodiment, the disclosure provides a method for removing heat from a body by selective thermal radiation, the method comprising the steps of:
a. placing a selective radiative cooling structure in thermal communication with a surface of the body, the selective radiative cooling structure comprising a selectively emissive layer and a solar-reflective layer in contact with the selectively emissive layer, wherein the selectively emissive layer comprises a polymer and the solar spectrum reflective layer comprises a metal film, the solar spectrum reflective layer being in thermal communication with the body and the selective radiative cooling structure being characterized by a solar absorptivity from 0 to 15% over wavelength ranging from 0.3 µm to 3 µm and an average emissivity ranging from 0.6 to 1.0 over the wavelength ranging from 7 µm to 13 µm;
b. transferring heat from the body to the selective radiative cooling structure; and
c. radiating heat from the selectively emissive layer of the selective radiative cooling structure.

As previously described the solar reflective layer in examples is a metal film or a metal substrate. Further, in some embodiments, the selectively emissive layer further comprises a plurality of dielectric particles dispersed in the polymer as described herein.

A solar-reflective and infrared emissive polymer-based radiative cooling sheet can be used to provide passive cooling effect for buildings (see FIG. 7A) and automobiles (see FIG. 7B). The radiative cooling sheet is directly attached to a building or a car roof for cooling, with the reflective layer contacting the building or car roof. The cooling effect comes from two aspects: 1) a large amount (e.g. ≥90%) of incident solar radiation can be reflected by the radiative cooling sheet's metal reflective layer, which greatly reduces the heat gain from solar radiation; 2) infrared radiative emission (e.g. ≥100 W/m$^2$) from the radiative cooling sheet to the sky. This application is particularly suitable for passive cooling of light-weight buildings in tropical and sub-tropical regions. FIG. 7A: 150 building; 3 solar incident radiation; 4 radiative cooling flux from radiative cooling sheet to the sky; 1 radiative cooling sheet attached to roof; 6 building internal heat gain; 9 the reflected solar radiation. FIG. 7B: 180 car; 1 radiative cooling sheet attached to car roof.

The polymer-based radiative cooling sheets disclosed herein can also be used in combination with a cold storage system. For example, the radiative cooling sheet is incorporated in a cold collection device (i.e., cold collector) in which coldness from the radiative cooling sheet is transferred to heat transfer fluid running inside the cold collector.

In some embodiments, the present disclosure provides a cold collection system comprising a. a plurality of cold collection devices, each cold collection device configured to be in thermal communication a cooling fluid;

b. a plurality of selective radiative cooling structures, each selective radiative cooling structure being in thermal communication with the surface of one of the plurality of cold collection devices and each selective radiative cooling structure comprising a selectively emissive layer comprising a polymer, wherein the selectively emissive layer of each selective radiative cooling device is in thermal communication with one of the plurality of cold collection devices and each selective radiative cooling structure is characterized by an average emissivity ranging from 0.5 to 1.0 over the wavelength range 7 μm to 14 μm.

In an embodiment, the cold collection system further comprises a heat exchanger. For example a cold collection device is configured to be in fluidic communication with the heat exchanger when a flow conduit connects the cold collection device and the heat exchanger. Such a flow conduit allows a heat exchange fluid (e.g. a liquid) to transfer cold from the cold collection device to the heat exchanger. In examples, the cold collection device is a passive thermosiphon or an active fluid channel array. In embodiments, each cold collection device is in contact with at least one radiative cooling structure.

In embodiments, a cold collection device comprises a selective radiative cooling structure as described herein configured for thermal communication with a thermal-coupling element which is additionally configured for thermal communication with a plurality of conduits for flow of a heat transfer fluid. FIG. 8A illustrates an assembly of cold collection devices 200 while FIG. 8B illustrates a cross-section along A-A. As illustrated in FIGS. 8A and 8B, the cold collector 200 includes radiative cooling sheet 1 coated on a metal sheet to provide radiative cooling power. In this embodiment, the radiative cooling sheet is solar-reflective and infrared-emissive. The cold energy is then transferred from the radiative cooling sheet to heat transfer fluid circulating through tubes 240. The tubes are attached (e.g. welded) to the metal sheet with good thermal contact. After passing through the cold collector, the heat transfer fluid is cooled. The cold collector is insulated with thermal insulation material 240 at the bottom and sides. At the top of the cold collector, a cover 230 is used to prevent convective thermal energy loss to ambient air. FIGS. 8A and 8B: 1 radiative sheet cooling (coated on metal sheet in this figure); 220 tube; 230 cover; 240 insulation material; 250 heat transfer fluid. The cold collection device shown in FIGS. 8A and 8B is an active cold collection device that uses a pump to circulate water through it. Active cold collection devices also include channel arrays.

Passive cold collection devices can also be used. A passive thermosiphon type cold collection device is depicted in FIGS. 8C and 8D and can collect cold thermal energy automatically. FIGS. 8C and 8D give a 3D view and a side view of the thermosiphon respectively. It includes a flat channel 260 which provides a panel (e.g. of polycarbonate) where the solar reflective and infrared emissive radiative cooling sheet can be laminated on, a water collection tube 270, a return pipe 280 and a local cold storage 290 that can temporary store cold thermal energy. The thermosiphon is filled with a heat transfer fluid (e.g. water). When the radiative cooling sheet is working, it cools down the heat transfer fluid inside the flat channel. The decrease of fluid temperature drives the fluid to move downward by natural convection. The heat transfer fluid then flows into water collection tube, return pipe, and finally the local cold storage. Heat transfer fluid circulates inside the thermosiphon due to the radiative cooling sheet. Cold energy is stored in local cold storage automatically without the assistance of an external device. This is the cold charging process. For cold discharging process, an external pump will bring the cold energy inside local cold storage to places where the stored cold energy can be used.

A cold collection device can be used to provide cooling for buildings, data centers, and any other systems that needs to be thermally regulated. In general, internal heat gain of buildings includes lighting, equipment and human body heat dissipation. FIG. 9 shows an active building cooling system with roof-integrated cold collector. The cold thermal energy is collected and stored in a cold storage tank 320 with a heat exchanger inside. The working fluid flowing between cold collector and cold storage tank is driven by a pump. The cooled water inside cold storage tank is then circulated through the radiant ceiling by another pump. The radiant ceiling cools down room temperature through both radiation and convection mechanisms. The cooling system shown in FIG. 9 can either work independently, or in combination with a conventional air-conditioning system to reduce electric energy consumption. This cooling system is suitable for both residential and commercial buildings. The cold collection device used in this application can be either an active or a passive type. FIG. 9: 150 building; 200 roof-integrated cold collection device including radiative cooling sheet; 4 radiative cooling flux from cold collection device to the sky; 320 cold storage tank; 350 pump; 360 heat exchanger; 160 radiant ceiling; 6 building internal heat gain; 7 radiative flux from room to radiant ceiling; 8 convective heat transfer from room air to radiant ceiling.

A cold collection device can also be used to provide supplemental cooling for power plant condenser (see FIG. 10A). In an embodiment, the cooling water coming out of power plant enters an air-cooled condenser to get cooled by using ambient air. However, the performance of the air-cooled condenser is dictated by ambient dry bulb temperature that is subject to large temperature excursions. Power plant efficiency is dependent on the cooling water temperature that enters the power plant condenser. Lower cooling water temperature leads to higher efficiency. Under these circumstances, if the outlet cooling water temperature from the air-cooled condenser meets the power plant energy efficiency requirement, it goes directly back to the power plant condenser through the bypass. However, if not, the cooling water can be further cooled by a cold storage tank that has a temperature lower than the ambient and is cooled by using radiative cooling structure. As shown, heat transfer between cooling water and the cold storage tank is through a heat exchanger. Multiple cold storage tanks are connected in parallel and are used in series. Cold storage tank has two working modes, namely cold charging and cold discharging. Once a cold storage tank is fully discharged (i.e. cannot be used to cool down the cooling water any more), it switches to cold charging mode. The cold charging mode is driven by a pump that connects one cold storage tank with multiple cold collection devices. The multiple cold collectors that emit radiative flux to the sky are connected in parallel. In an embodiment, the cold collection device used is the active cold collector shown in FIG. 8A. The pump (i.e. 350) works continuously in this application. FIG. 10A: 200 Cold collection device; 4 radiative flux to the sky; 350 pump; 320 cold storage tank; 360 heat exchanger; 406 valve; 407 pump;

408 ambient air; 409 air-cooled condenser (ACC); 410 power plant condenser; 411 power plant working fluid from turbine; 412 bypass For the radiative cooling system depicted in FIG. 10A, the thermosiphon shown in FIG. 8C also can be used as cold collection device. Under this circumstance, since thermosiphon can automatically collect cold thermal energy, the pump (i.e. 350) will work intermittently. An operating schedule is needed for the system, an example of which is given in FIG. 10B. FIG. 10B shows a 12-hour operating schedule for a single cold storage tank. The cold storage tank has one charging-discharging cycle and the thermosiphon has 10 charging-discharging cycles during this 12-hour period. The thermosiphon cools down the heat transfer fluid inside local cold storage. Once local cold storage gets cooled, the pump (i.e. 350) will start for a short period of time (e.g. 3-5 mins) and transfer that cold energy to the cold storage tank. The cold storage tank gets cooled after 10 times of charging processes. One cold storage tank may have hundreds of thermosiphons connected to it.

In further embodiments, the present disclosure provides methods for making a selective radiative cooling structure, the methods comprising the steps of:
 a. extruding a feed material comprising polymer through a die to form a film or sheet, wherein the polymer is characterized by an absorptivity of 0.6 to 1 in the range 5 µm to 50 µm; and
 b. cooling the film or sheet.

In an example, the polymer portion of the feed material is molten as it passes through the die and the polymer portion of the film or sheet is solidified in step b. In additional embodiments the feed material further comprises a plurality of dielectric particles, the volume percentage of the dielectric particles ranging from 2% to 25% and the particles characterized by an average size ranging from 3 µm to 30 µm and the film or sheet is a composite film. In an embodiment, the particles are characterized by an average effective diameter selected from the range of 3 µm to 30 µm. Exemplary polymers and particles for radiative cooling structures are described elsewhere herein. In embodiments, the polymer-based sheet of the radiative cooling structure can be 10 µm to 3 millimeters, from 10 µm to 1 mm, from 10 µm to 500 µm, from 10 µm to 100 µm, from 100 µm to from 750 µm, from 200 µm to 1000 µm, from 200 µm to 750 µm, from 250 µm to 500 µm or from 500 µm to 1000 µm in thickness.

FIG. 11 shows a schematic of an extrusion or die-casting system with rollers. In this embodiment the polymer feed 505 is fed to the extruder 510 and the melted material(s) are extruded and cast through the die 520 onto a pick-up roller 530. The pick-up roller may be chilled to accelerate hardening of the polymer sheet 540. An additional roller 550 may be coupled to the pick-up roller, to additionally aid in hardening of the sheet and optionally add thickness-control by pressing. The polymer-based films 540 produced may either be taken from the extrusion line as-is, or wrapped on additional rollers for storage and further use. Sheets as wide as 1 to 3 meters and up to kilometers in length can be produced in this manner.

In some embodiments, once a polymer sheet has been produced, an additional material sheet or sheets such as those that have been discussed can be coated or deposited with an additional layer of material e.g., a protective or barrier sheets and/or reflective sheet. Examples of additional layers of material useful in radiative cooling devices are described above. In one embodiment, a metal reflective sheet is implemented by physical vapor deposition, such as sputtering, thermal or electron-beam evaporation, or spraying method; or chemical deposition methods, such as solution synthesis, electro-chemical metallization, or atomic layer deposition. FIG. 12 shows a schematic drawing of a web coating system for physical vapor deposition, including film 540 and two rollers 560*a* and 560*b*. The polymer film may be pre-treated by plasma or ion beams to increase polymer surface adhesion before it gets into the deposition zone, where barrier, reflective, and/or thermal coupling layers can be deposited. These layers can be deposited via any of the method described above in the deposition zone of the web coater. The deposition apparatus is indicated by 570. Alternative and optional layers as aforementioned including antireflection coatings, barrier layers, thermal coupling layers, and UV protection layers can be prepared in similar approaches. In alternative embodiments a reflective or barrier layer(s) can be produced first, and the polymer or polymer-based sheet applied to this layer or layers.

BRIEF DESCRIPTION OF THE DRAWINGS

FIGS. 8A and 8B: FIG. 8A: schematic illustration of a radiative cooling structure in contact with multiple cold collection devices and FIG. 8B: cross section through FIG. 8A along A-A.

FIG. 8C: schematic illustration of a thermosiphon that can be used in contact with the radiative cooling structure to collect coldness enabled by radiative cooling structure and FIG. 8D: side view of the thermosiphon.

FIG. 15 Glass-polymer hybrid metamaterial.

FIG. 17 Spectroscopic response of the hybrid metamaterial.

FIG. 18 Performance of scalable-manufactured hybrid metamaterial for effective radiative cooling. (FIG. 18A) A photo showing the 300-mm-wide hybrid metamaterial thin film that was produced in a roll-to-roll manner, at a speed of 5 meters per minute. The film is 50 μm in thickness and not yet coated with silver. (FIG. 18B) A 72-hour continuous measurement of the ambient temperature (black) and the surface temperature (red) of an 8-in-diameter hybrid metamaterial under direct thermal testing. A feedback-controlled electric heater keeps the difference between ambient and metamaterial surface temperatures less than 0.2° C. over the consecutive three days. The heating power generated by the electric heater offsets the radiative cooling power from the hybrid metamaterial. When the metamaterial has the same temperature as the ambient air, the electric heating power precisely measures the radiative cooling power of the metamaterial. The shaded regions represent nighttime hours. (FIG. 18C) The continuous measurement of radiative cooling power over three days shows an average cooling power >110 $W/m^2$ and a noon-time cooling power of 93 $W/m^2$ between 11 am-2 μm. The average nighttime cooling power is higher than that of the day-time, and the cooling power peaks after sunrise and before sunset. The measurement error of the radiative cooling power is well within 10 $W/m^2$ (32).

FIG. 22A. The ambient temperature and the hybrid metamaterial surface temperature measured over an 18-hour-period of time on Oct. 8, 2016 in Boulder, Colo. The shaded region represents nighttime hours. With the feedback-controlled electric heater, the surface temperature closely follows the ambient temperature. The inset shows the initial dynamics when the control loop is switched on. (FIG. 22B) The temperature difference between the measured ambient temperature and the hybrid metamaterial surface. The histograms of the (FIG. 22C) day- and (FIG. 22D) nighttime temperature differences show small deviations of 0.2° C. and 0.1° C., respectively.

FIG. 24. Direct radiative cooling of a water body.

DETAILED DESCRIPTION OF THE INVENTION

Figure 1:
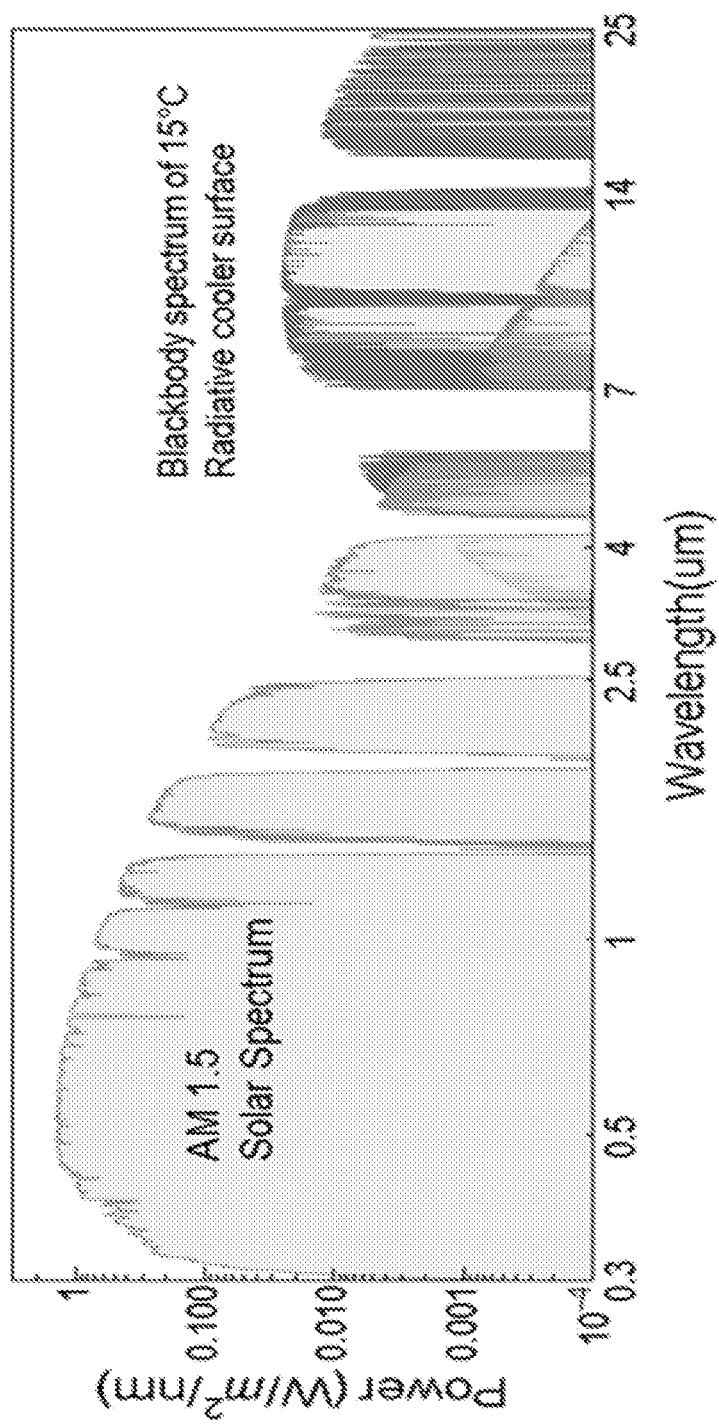
FIG. 1: spectral irradiance of AM1.5 on earth surface and radiation spectrum of a black body surface at 15° C. through the atmospheric transmission window.
Figure 2:
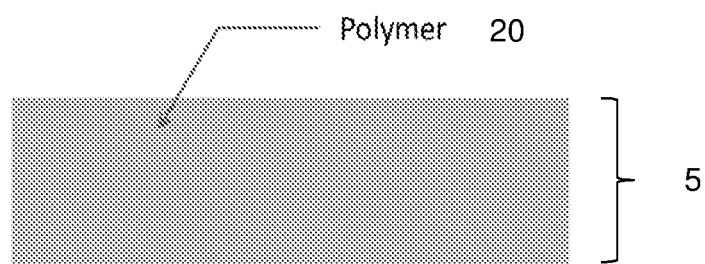
FIG. 2: schematic illustration of an emissive layer 5 of polymer 20.
Figure 3A:
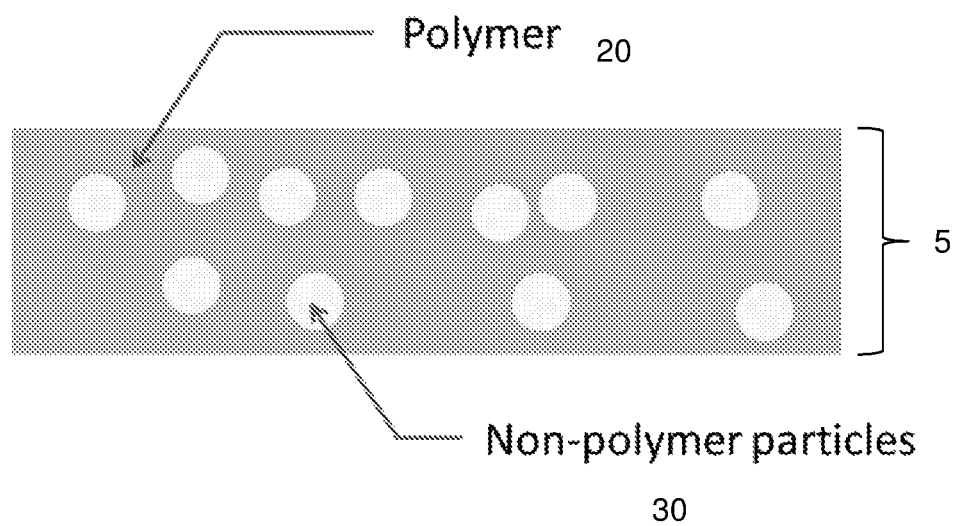
FIG. 3A: schematic illustration of an emissive layer 5 including polymer 20 including particles dispersed in polymer matrix 30.
Figure 3B:
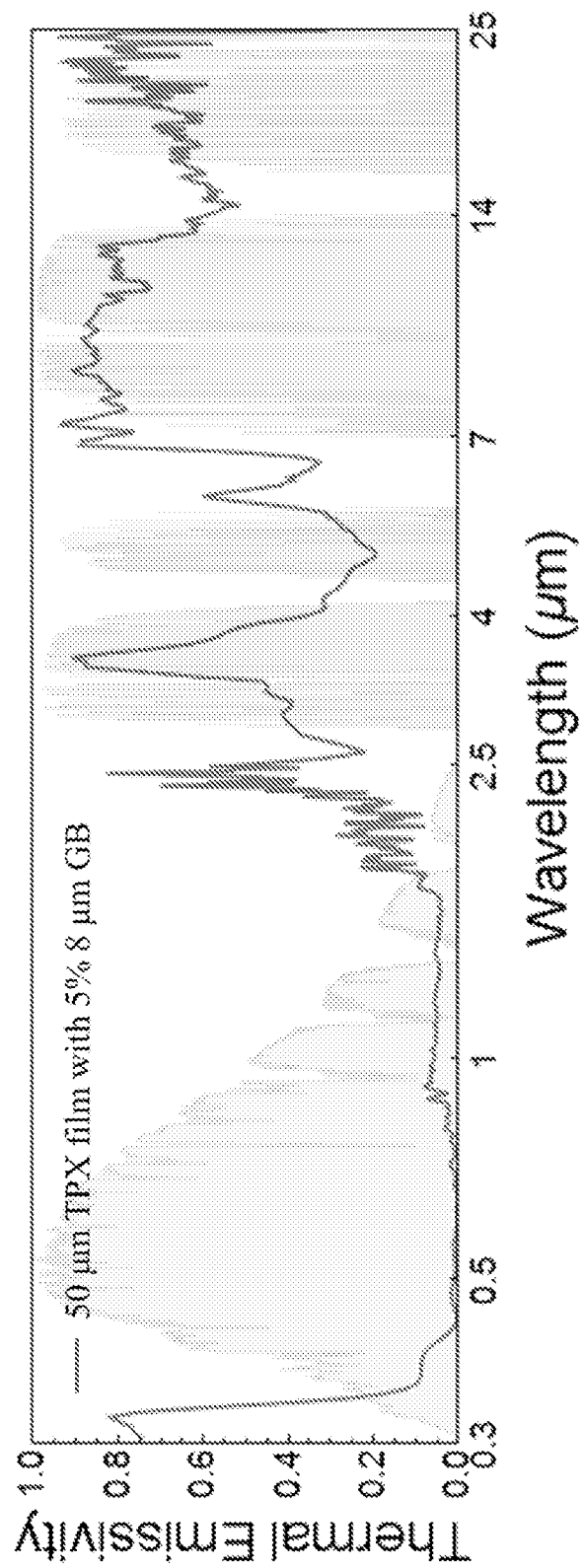
FIG. 3B shows the absorptivity/emissivity as a function of wavelength for a 50-µm-thick polymethylpentene film with 5% 8-µm-diameter solid silica microspheres.
Figure 4A:
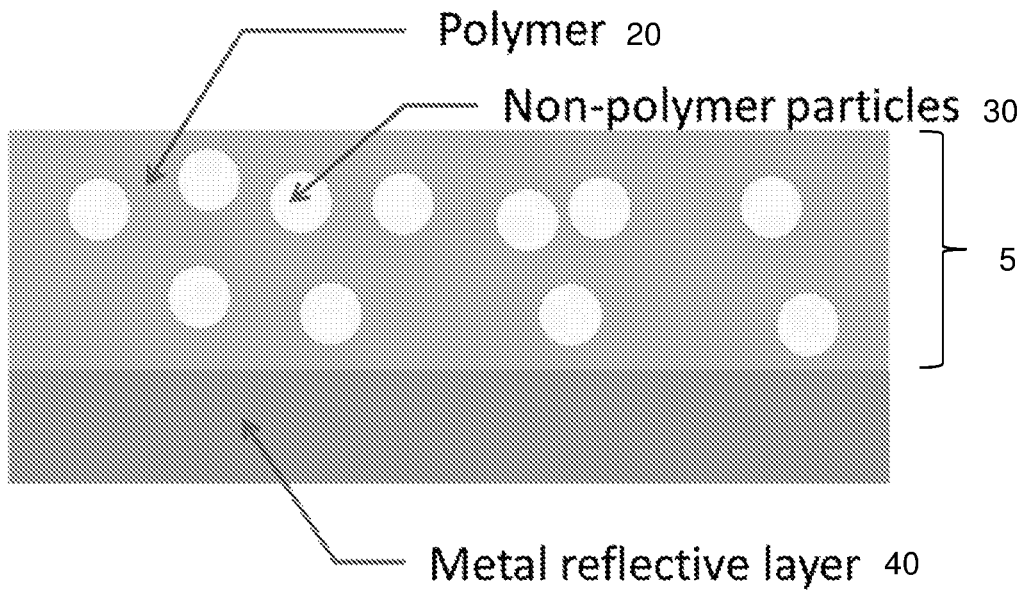
FIG. 4A: schematic illustration of an emissive layer 5 including polymer 20 and particles 30 in contact with metal reflective layer 40.
Figure 4B:
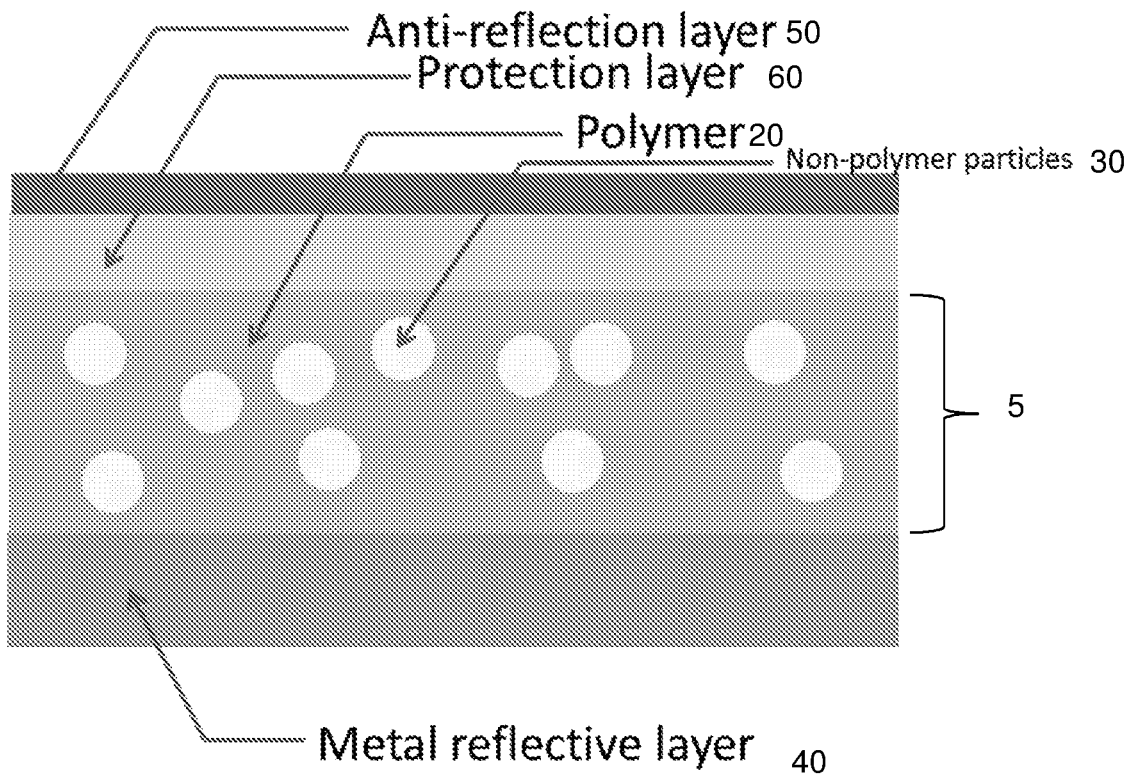
FIG. 4B: schematic illustration of an emissive layer 5 including polymer 20 and particles 30; one face of the emissive layer is in contact with metal reflective layer 40 and the other face of the emissive layer is in contact with an anti-reflection layer 50, which in turn is in contact with a protection layer 60.
Figure 4C:
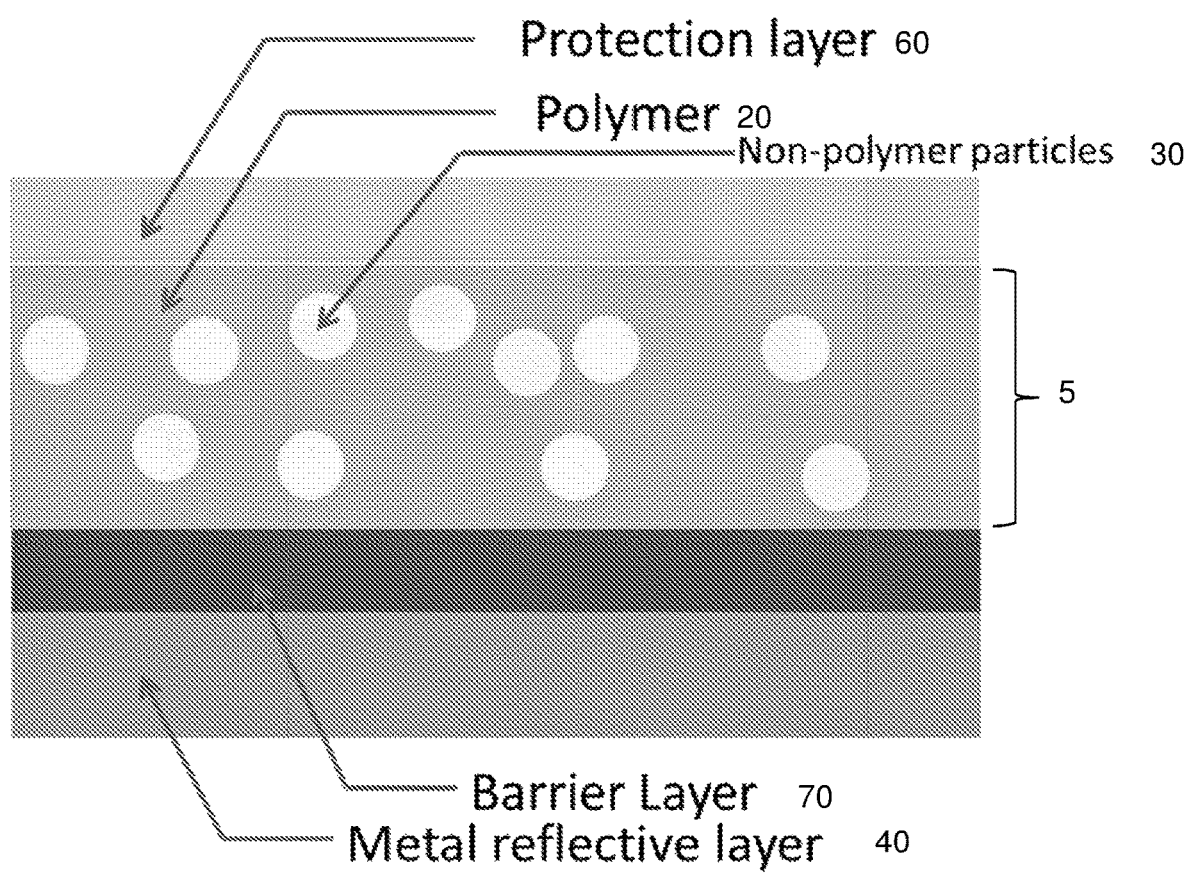
FIG. 4C: schematic illustration of an emissive layer 5 including polymer 20 and particles 30; one face of the emissive layer is in contact with a barrier layer 70, which in turn is in contact with a metal reflective layer 40 and the other face of the emissive layer is in contact with a protection layer 60.
Figure 4D:
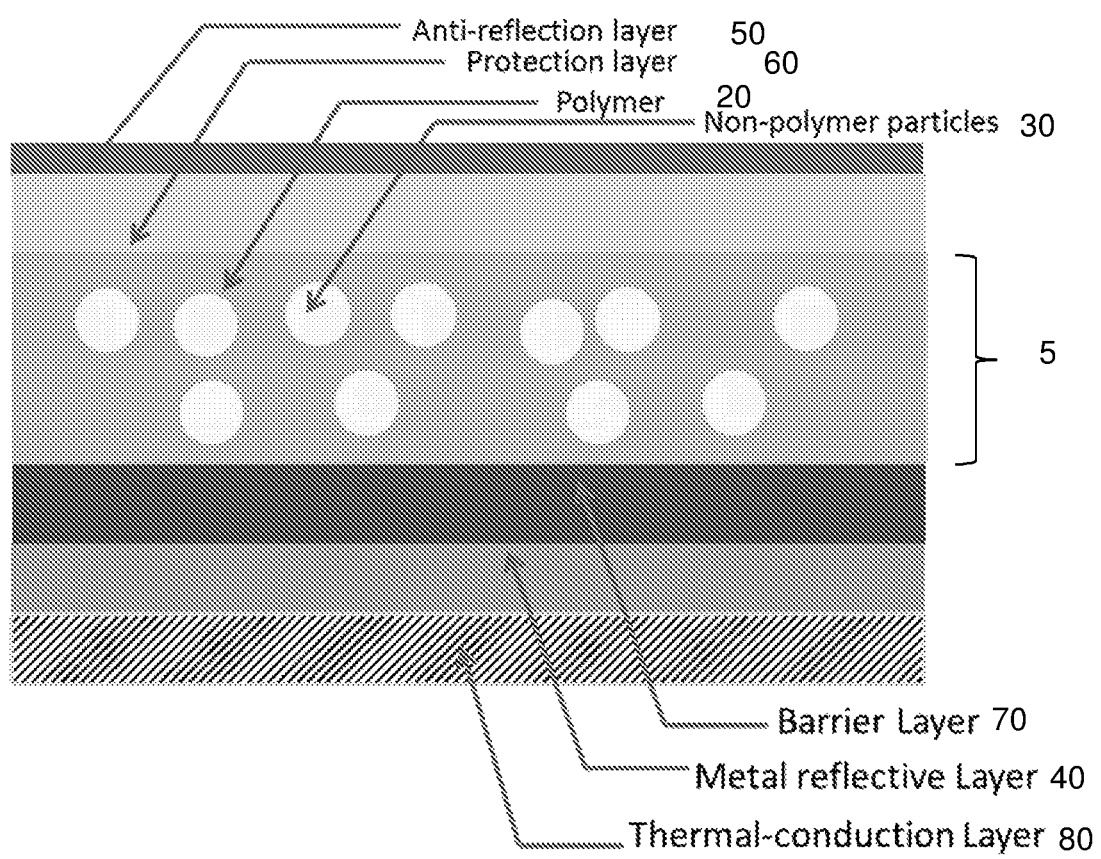
FIG. 4D: schematic illustration of an emissive layer 5 including polymer 20 and particles 30; one face of the emissive layer is in contact with a barrier layer 70, which in turn is in contact with a metal reflective layer 40, which in turn is in contact with a thermal-conduction layer and the other face of the emissive layer is in contact with an anti-reflection layer 50, which in turn is in contact with a protection layer 60.
Figure 4E:
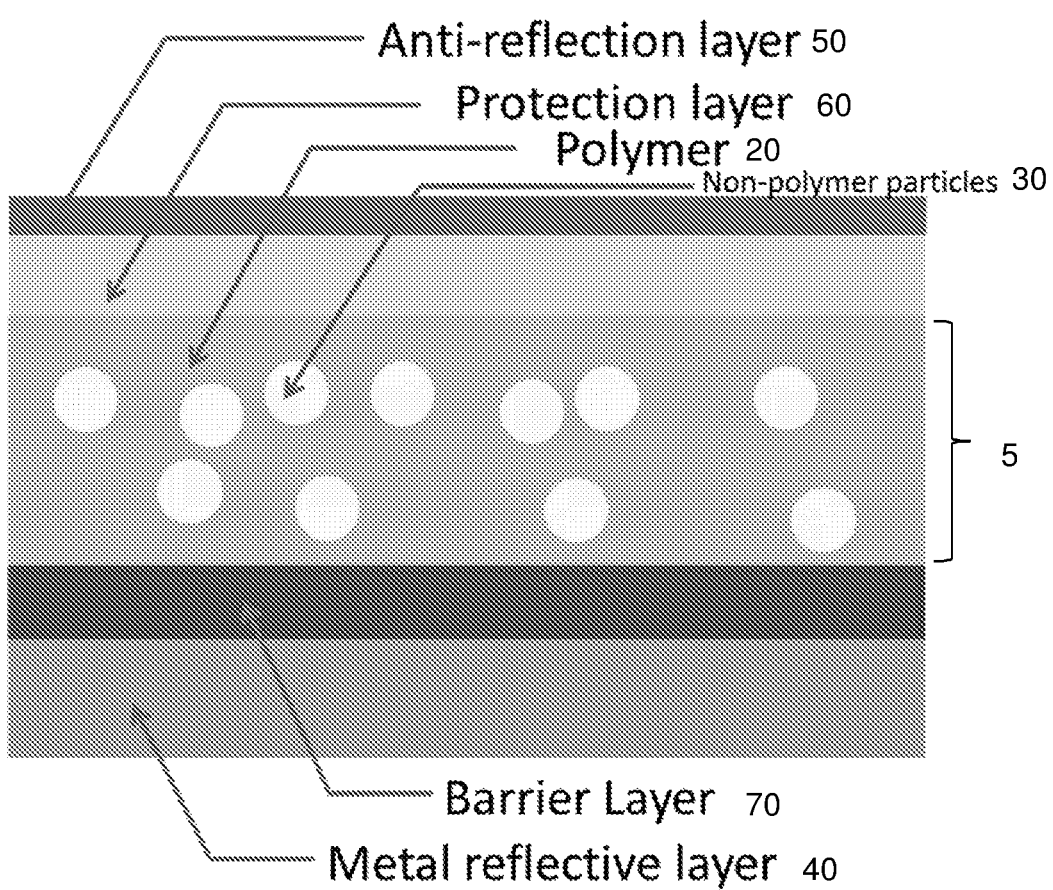
FIG. 4E: schematic illustration of an emissive layer 5 including polymer 20 and particles 30; one face of the emissive layer is in contact with a barrier layer 70, which in turn is in contact with a metal reflective layer 40 and the other face of the emissive layer is in contact with an anti-reflection layer 50, which in turn is in contact with a protection layer 60.
Figure 5:
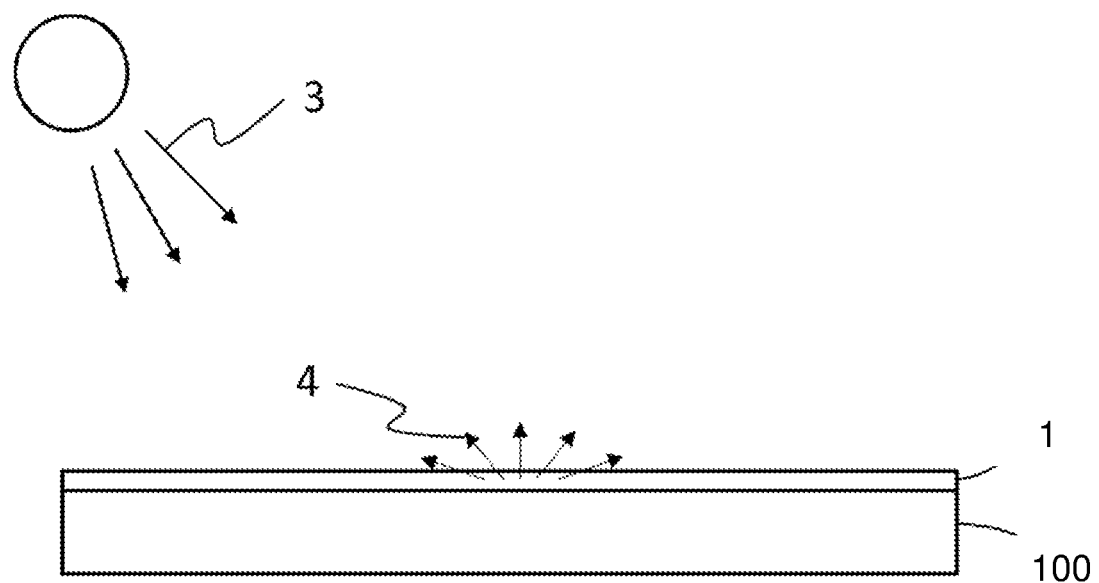
FIG. 5: schematic illustration of a radiative cooling sheet directly attached to the top of a solar cell.
Figure 6:
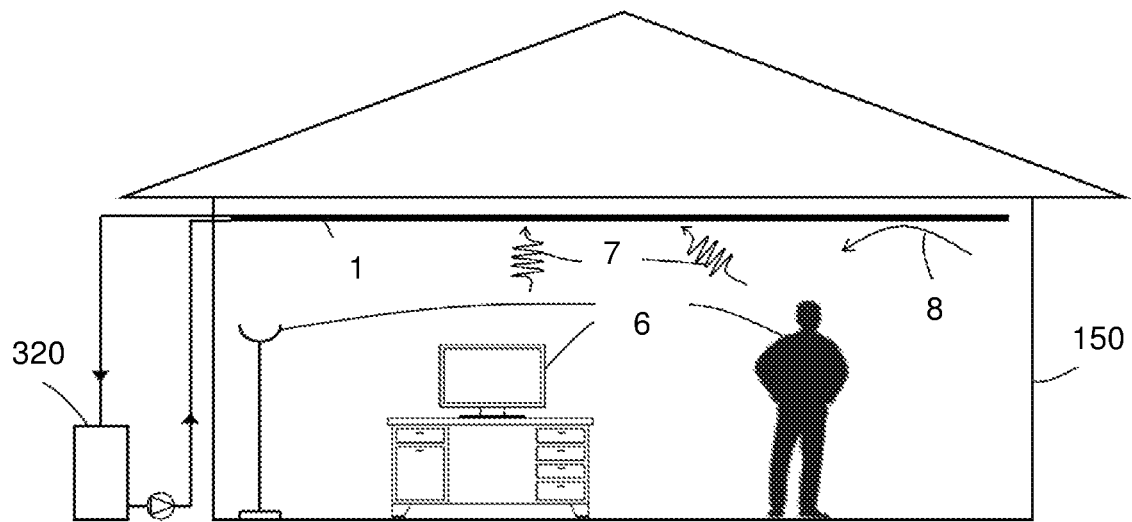
FIG. 6: schematic illustration of a radiative cooling sheet directly attached to a radiant ceiling panel.
Figure 7A:
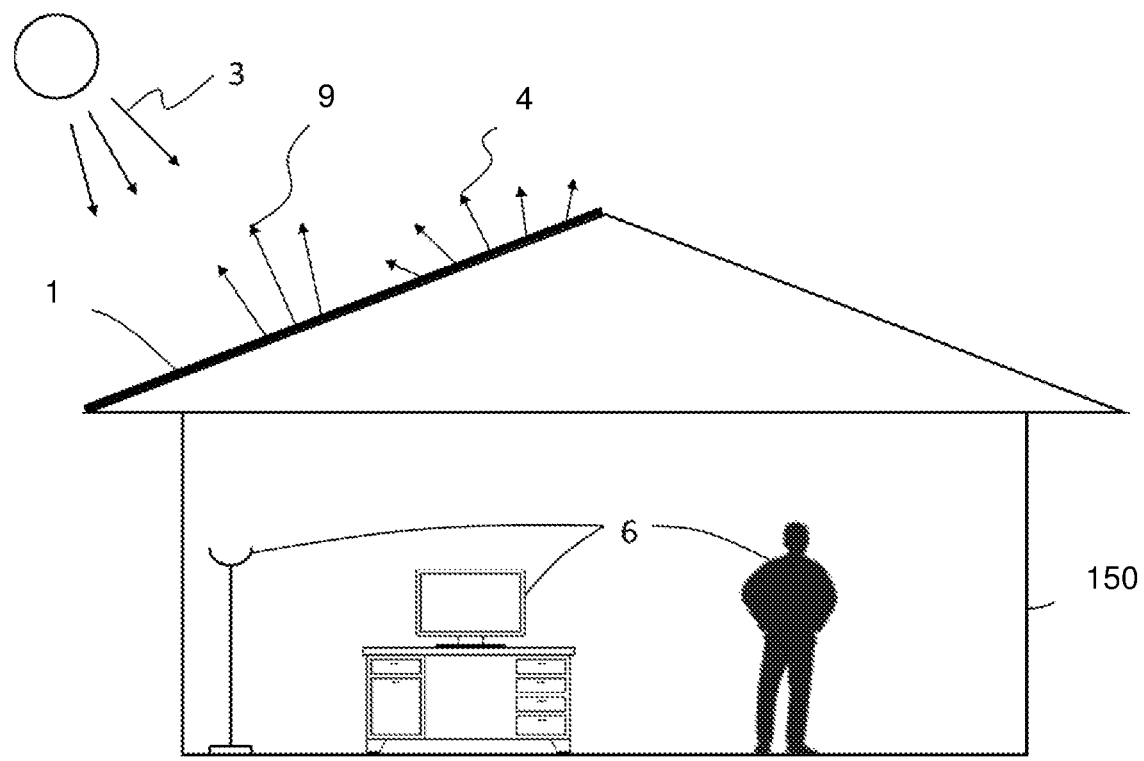
FIG. 7A: schematic illustration of a radiative cooling sheet with reflective layer directly attached to the roof of a built structure.
Figure 7B:
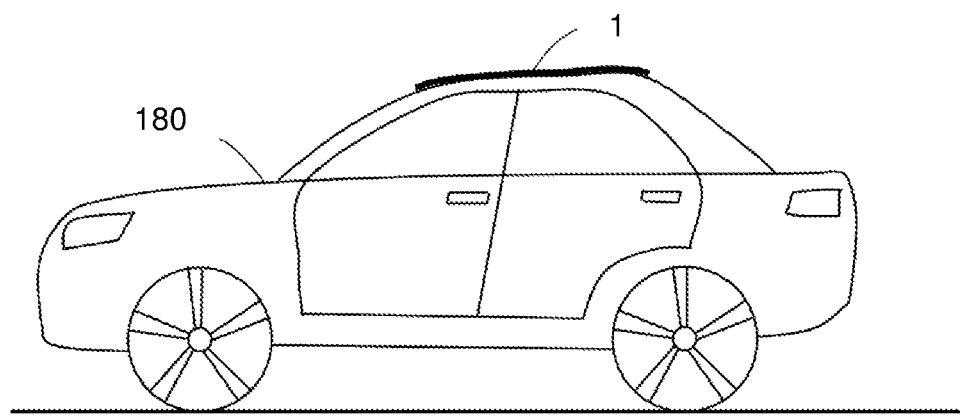
FIG. 7B: schematic illustration of a radiative cooling sheet with reflective layer directly attached to the roof of a car.
Figure 8C:
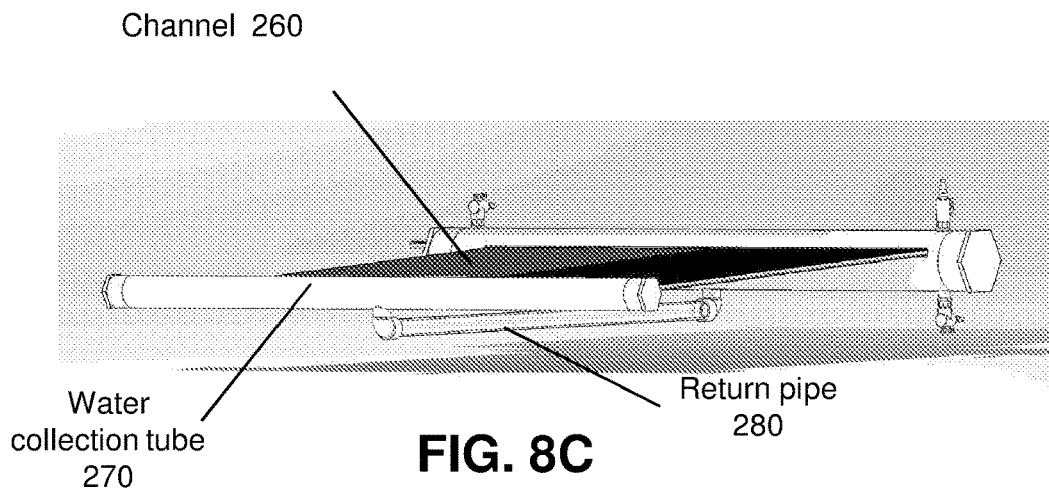
FIGS. 8C and 8D.
Figure 8D:
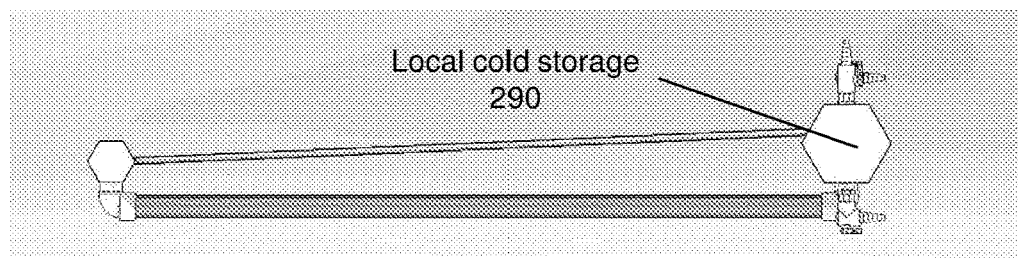
Figure 9:
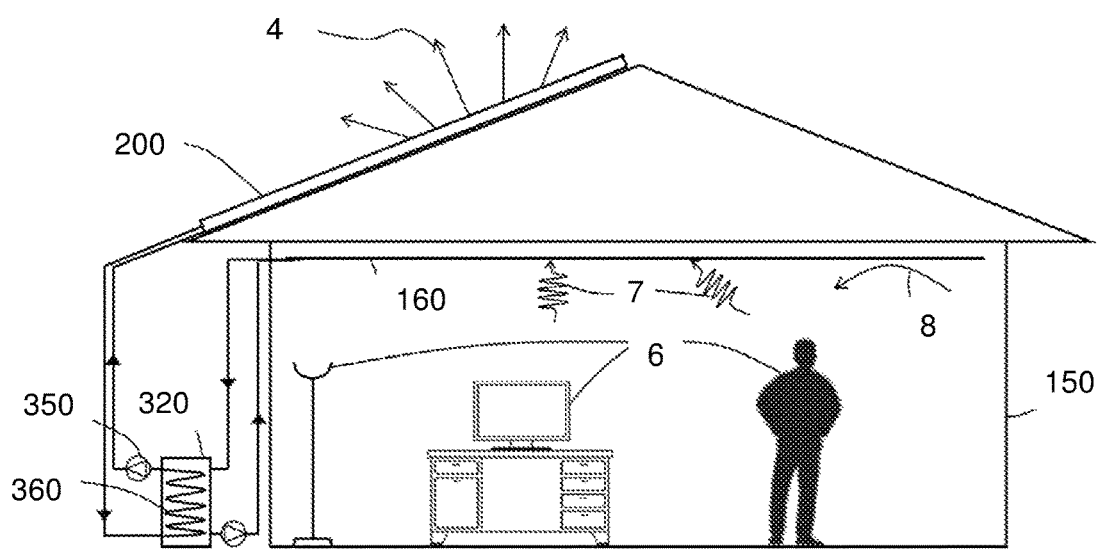
FIG. 9: schematic illustration of an active cooling system for buildings where radiative cooling structures is used to enable the cooling for the cold storage system.
Figure 10A:
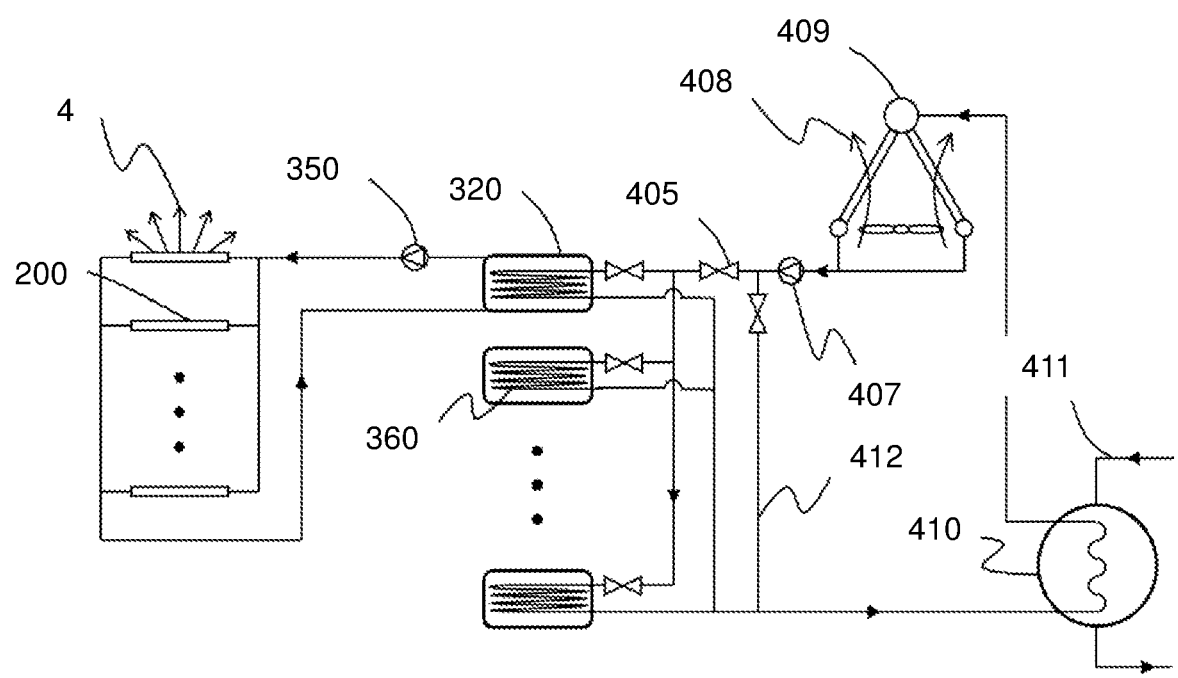
FIG. 10A: schematic illustration of multiple cold collection devices for supplemental cooling for a power plant condenser.
Figure 10B:
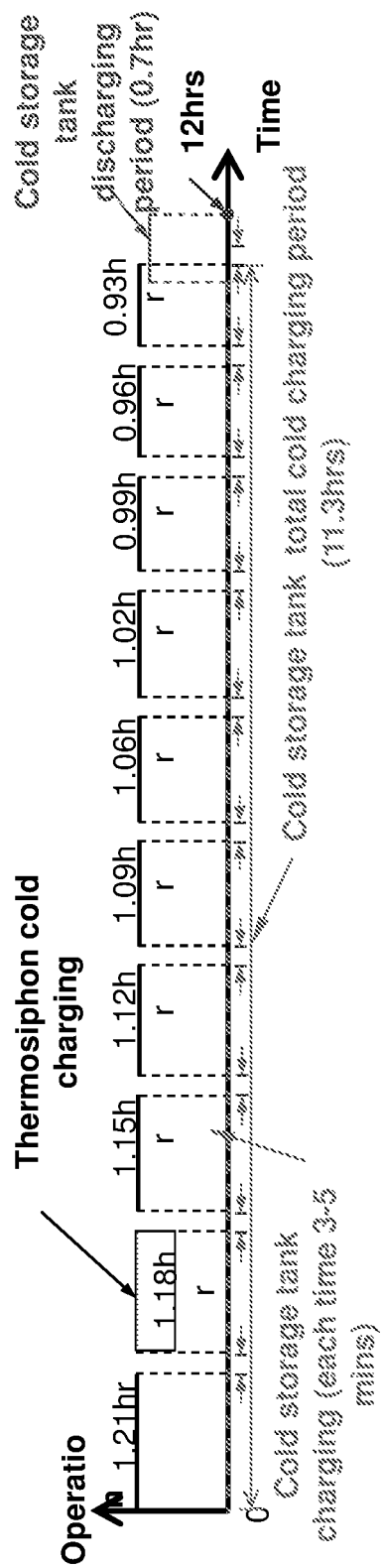
FIG. 10B: An exemplary 12-hour operating schedule to enable cold collection and storage using a passive thermosiphon to collect the cold achieved using selective radiative cooling structure.
Figure 11:
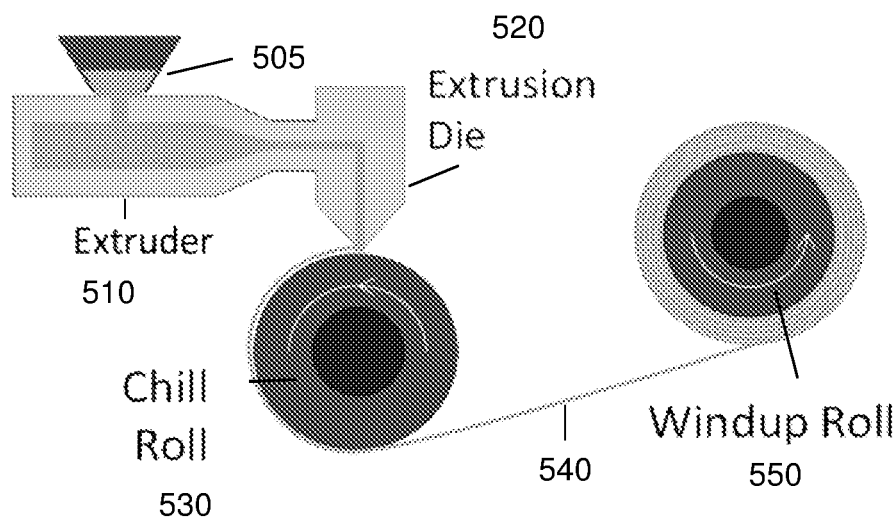
FIG. 11: schematic illustration of an apparatus for extrusion of a polymer-based film.
Figure 12:
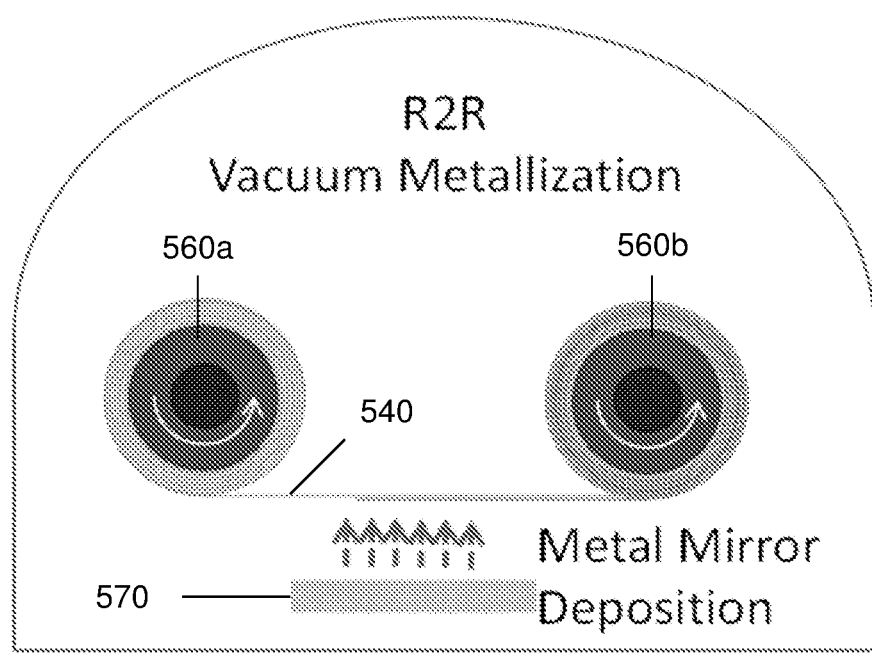
FIG. 12: schematic illustration of an apparatus for coating a film with oxides and metals.

In the drawings, like reference numbers refer to like elements.

The electromagnetic spectrum can be classified into several regions. Regions referred to herein are the infrared region (wavelength approximately 1 mm to 750 nm), visible region (wavelength approximately 750 nm to 400 nm) and the ultraviolet region (wavelength approximately 400 nm to 40 nm). The infrared region has also been classified into sub-regions using various classification schemes; in the ISO classification scheme the mid-infrared is approximately 3 μm to 50 μm. As used herein the radiant flux is the radiant energy per unit time (e.g. W), the irradiance is the radiant flux received by a surface per unit area (e.g. Wm$^{-2}$) and the spectral irradiance is the irradiance of a surface per unit wavelength (e.g. Wm$^{-2}$ nm$^{-1}$).

Electromagnetic radiation emitted from matter at a temperature above absolute zero Kelvin may be referred to as thermal radiation. The solar spectrum refers to the distribution of electromagnetic radiation emitted by the sun, as a function of electromagnetic wavelengths. Most of the solar energy is over a wavelength from about 0.3 μm to about 3 μm, as can be seen from FIG. 1.

Emissivity specifies how well a real surface radiates electromagnetic energy as compared with a black-body and can range between 0 and 1. The directional spectral emissivity is the ratio of the emissive ability of the real surface to that of a black body. A total emissivity is averaged with respect to all wavelengths; a hemispherical emissivity is averaged with respect to all directions. As used herein, a selectively emissive layer is configured to emit electromagnetic radiation over a range of wavelength with a desirable emissivity between 0 and 1 at a temperature above absolute zero.

As used herein, a selectively emissive layer has an emissivity that is wavelength-selective. A selectively emissive layer is configured to thermally-generating electromagnetic emissions at temperatures other than absolute zero Kelvin and is not a blackbody. Since emissivity correlates with absorptivity, a selectively emissive layer is also a selectively absorptive layer. In embodiments, the selectively emissive layer has high emissivity in at least some portions of the infrared portion of the spectrum, but has limited emission in at least some portions of the solar spectrum. Such a selectively emissive layer is also selectively absorptive, having high absorption in at least some portions of the infrared portion of the spectrum, but limited absorption in at least some portions of the solar spectrum.

As used herein, average size refers to the numerical average or arithmetic mean of the effective diameter. In an embodiment, for example, average size refers to the sum of effective diameters of all particles divided by the number of particles. Given that average size refers to effective diameter, particles may have various shapes are not limited to spherical or sphere-like particles. Distributions of particles may also vary, for example, particles may have narrow or broad distributions and may be monodisperse or polydisperse.

As used herein, absorptivity is defined as the fraction of radiation energy incident on a surface of a body that is absorbed by the body. The incident radiation depends on the radiative conditions at the source of the incident energy. In an embodiment, the average absorptivity is a hemispherical absorptivity averaged over the wavelength range of interest.

As used herein, transmissivity is defined as the fraction of radiation energy incident on the surface of a body that is transmitted by the body. As used herein, transmissive material has a transmissivity on average greater than zero for radiation in the specified wavelength range. y. In an embodiment, the average transmissivity is a hemispherical transmissivity averaged over the wavelength range of interest. In some embodiments a transparent material has a transmissivity greater than 0.9 for the specified wavelength range.

As used herein reflectivity is defined as the fraction of radiation energy incident on a body that is reflected by the body. Solar reflectivity is defined as the fraction of radiation energy incident on a body that is reflected by the body in a specified region of the solar spectrum (e.g. 0.3 µm to 3 µm). In an embodiment, the solar reflectivity is averaged over the specified region of the spectrum. In an embodiment, the average reflectivity is a hemispherical reflectivity averaged over the wavelength range of interest.

As used herein, room temperature is approximately 20° C. to 30° C.

Embodiments of the present invention also pertain to methods for manufacturing radiative cooling structures on size scales useful for relevant cooling applications. In some embodiments of the present invention, polymers or polymer-based materials is fed into an extruder, optionally an industrial extruder or die-caster, and is melted and extruded into thin sheets. As examples, the polymer fed to the extruder is in pellets, powdered, or any other dry form. In embodiments for producing composite emissive layers, the non-polymer materials, e.g., the dielectric or glass particles discussed above, are mixed into the polymer prior to, during or after melting of the polymer, and before extrusion. The non-polymer materials can be mixed in any manner and may be mixed to a uniform or near-uniform blend of the polymer and non-polymer materials. As discussed above, such polymer-based sheets can be 3 µm to several millimeters in thickness. The extruded sheets can be cast onto solid substrates or, in one embodiment, formed onto chilled rollers, forming standalone thin films.

In other embodiments, the polymer or polymer-based sheet can be manufactured by any one or combination of a variety of polymer production methods, including without limitation liquid or solution casting, blowing or blow molding, spinning, compression molding, spraying methods, and injection molding. For example, the initial polymer material may be mixed with non-polymer particles, melted, and the melted mixture blown, compressed, or otherwise molded into any thickness sheets. In other embodiments, the polymer may be provided in a fluid or liquid form so that the polymer may be applied directly to a surface, for example, by painting, brushing, coating or spraying. In some embodiments, the liquid polymer may have particles dispersed throughout. The polymer may require a curing process upon application or may dry to form the desired polymer layer.

All patents and publications mentioned in the specification are indicative of the levels of skill of those skilled in the art to which the invention pertains. All references cited herein are hereby incorporated by reference to the extent not inconsistent with the disclosure herewith. All references throughout this application, for example patent documents including issued or granted patents or equivalents; patent application publications; and non-patent literature documents or other source material; are hereby incorporated by reference herein in their entireties, as though individually incorporated by reference, to the extent each reference is at least partially not inconsistent with the disclosure in this application (for example, a reference that is partially inconsistent is incorporated by reference except for the partially inconsistent portion of the reference).

All patents and publications mentioned in the specification are indicative of the levels of skill of those skilled in the art to which the invention pertains. References cited herein are incorporated by reference herein in their entirety to indicate the state of the art, in some cases as of their filing date, and it is intended that this information can be employed herein, if needed, to exclude (for example, to disclaim) specific embodiments that are in the prior art. For example, when a compound is claimed, it should be understood that compounds known in the prior art, including certain compounds disclosed in the references disclosed herein (particularly in referenced patent documents), are not intended to be included in the claim.

When a group of substituents is disclosed herein, it is understood that all individual members of those groups and all subgroups, including any isomers and enantiomers of the group members, and classes of compounds that can be formed using the substituents are disclosed separately. When a compound is claimed, it should be understood that compounds known in the art including the compounds disclosed in the references disclosed herein are not intended to be included. When a Markush group or other grouping is used herein, all individual members of the group and all combinations and subcombinations possible of the group are intended to be individually included in the disclosure.

Every formulation or combination of components described or exemplified can be used to practice the invention, unless otherwise stated. Specific names of compounds are intended to be exemplary, as it is known that one of ordinary skill in the art can name the same compounds differently. When a compound is described herein such that a particular isomer or enantiomer of the compound is not specified, for example, in a formula or in a chemical name, that description is intended to include each isomers and enantiomer of the compound described individual or in any combination. One of ordinary skill in the art will appreciate that methods, device elements, starting materials and synthetic methods other than those specifically exemplified can be employed in the practice of the invention without resort to undue experimentation. All art-known functional equivalents, of any such methods, device elements, starting materials and synthetic methods are intended to be included in this invention. Whenever a range is given in the specification, for example, a temperature range, a time range, or a composition range, all intermediate ranges and subranges, as well as all individual values included in the ranges given are intended to be included in the disclosure.

As used herein, "comprising" is synonymous with "including," "containing," or "characterized by," and is inclusive or open-ended and does not exclude additional, unrecited elements or method steps. As used herein, "consisting of" excludes any element, step, or ingredient not specified in the claim element. As used herein, "consisting essentially of" does not exclude materials or steps that do not materially affect the basic and novel characteristics of the claim. Any recitation herein of the term "comprising", particularly in a description of components of a composition or in a description of elements of a device, is understood to encompass those compositions and methods consisting essentially of and consisting of the recited components or elements. The invention illustratively described herein suitably may be practiced in the absence of any element or elements, limitation or limitations which is not specifically disclosed herein.

The terms and expressions which have been employed are used as terms of description and not of limitation, and there is no intention in the use of such terms and expressions of excluding any equivalents of the features shown and described or portions thereof, but it is recognized that various modifications are possible within the scope of the invention claimed. Thus, it should be understood that although the present invention has been specifically disclosed by preferred embodiments and optional features, modification and variation of the concepts herein disclosed may be resorted to by those skilled in the art, and that such modifications and variations are considered to be within the scope of this invention as defined by the appended claims.

In general the terms and phrases used herein have their art-recognized meaning, which can be found by reference to standard texts, journal references and contexts known to those skilled in the art. The preceding definitions are provided to clarify their specific use in the context of the invention.

Although the description herein contains many specificities, these should not be construed as limiting the scope of the invention but as merely providing illustrations of some of the presently preferred embodiments of the invention. For example, thus the scope of the invention should be determined by the appended claims and their equivalents, rather than by the examples given.

The invention may be further understood by the following non-limiting examples.

Example 1: Polymethylpentene-Based Radiative Cooling Films

Figure 13A:
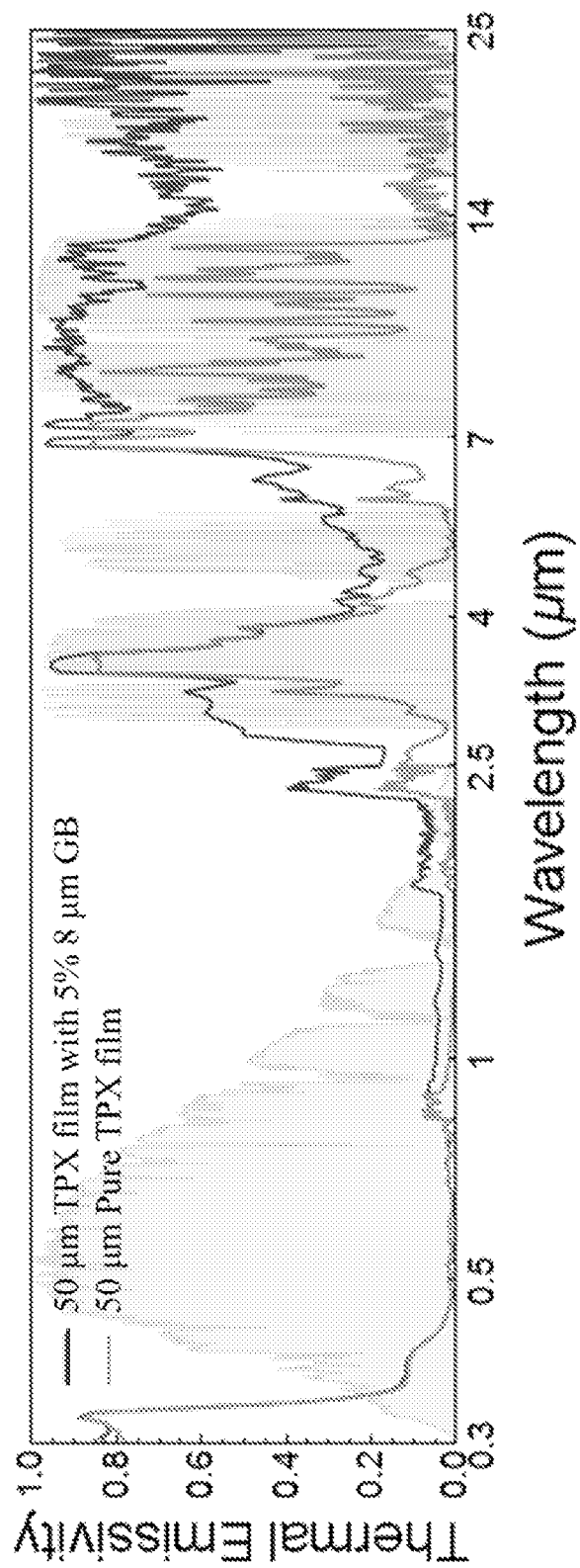
FIG. 13A shows the emissivity/absorptivity as a function of wavelength for a 50-μm-thick bare polymethylpentene (TPX™) films and a 50 μm thick film with 5% volume fraction of 8-μm-diameter solid silica microspheres.

FIG. 13A shows the emissivity/absorptivity as a function of electromagnetic wavelength for a 50-µm-thick bare polymethylpentene (TPX™) films and a 50 µm thick film with 5% 8-µm-diameter solid silica microspheres. The trace for the TPX™ film is lighter gray than the trace for the composite film. Polymethylpentene is index-matched with silica in the solar spectrum, but not in the infrared spectrum. The polymethylpentene film mixed with silica microspheres results in a high emissivity at IR wavelengths of 7-13 µm. Without wishing to be bound by any particular belief, the silica spheres are believed to act as infrared scatterers and resonantly interact with infrared radiation, contributing to improved infrared emissivity of the films.

Figure 13B:
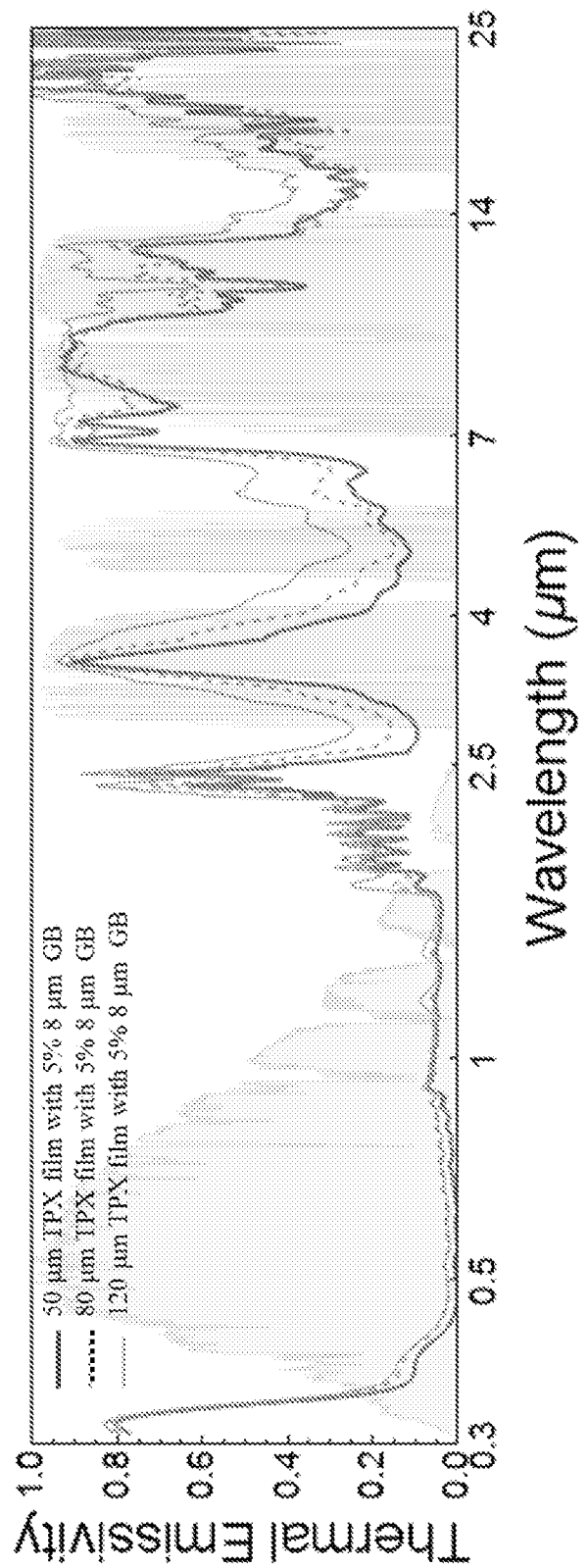
FIG. 13B shows the emissivity/absorptivity as a function of wavelength for polymethylpentene films of different thickness with 5% volume fraction of 8-μm-diameter solid silica microspheres.

FIG. 13B shows the emissivity/absorptivity as a function of wavelength for polymethylpentene films of different thickness with 5% volumetric fraction of 8-µm-diameter solid silica microspheres. (key: 50 µm film darker gray solid line, 80 µm film dashed line, 120 µm film lighter gray solid line), The thicker polymethylpentene film with silica microspheres increases the emissivity at IR wavelength of 7-13 µm without significant absorption effect in solar spectrum.

Figure 13C:
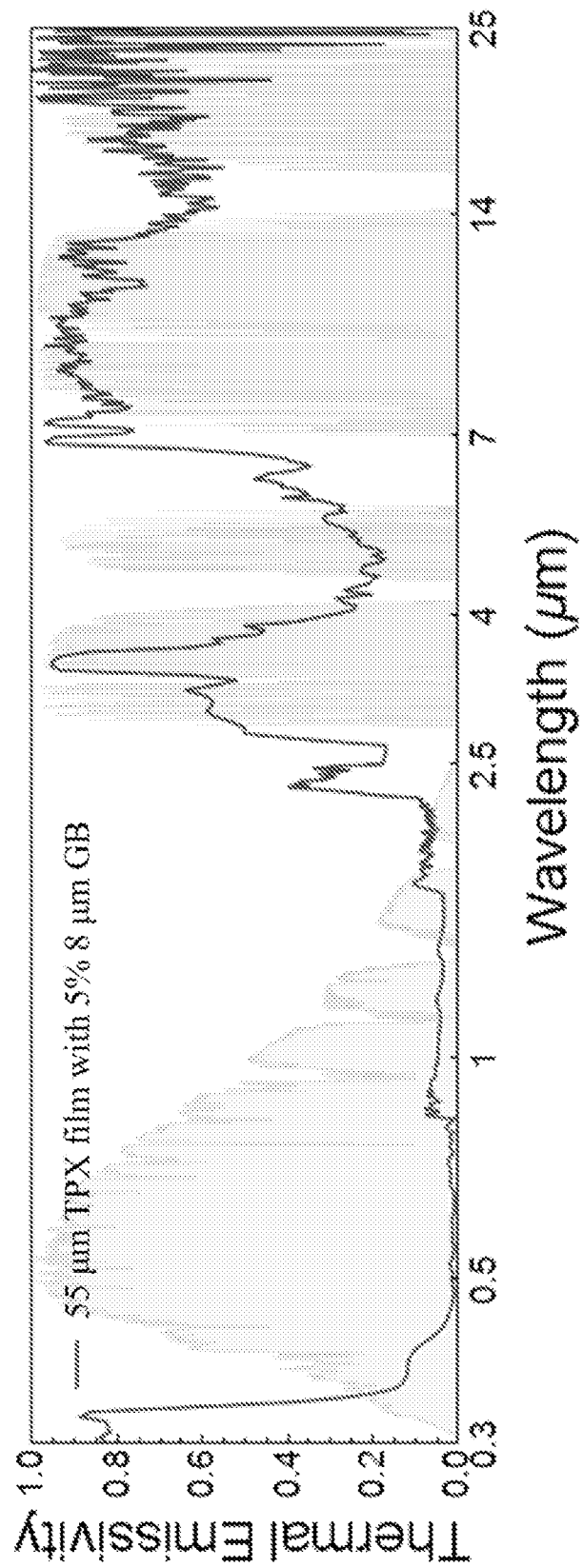
FIG. 13C shows the absorptivity/emissivity as a function of wavelength for of 55-μm-thick polymethylpentene film with 5% volume fraction of 8-μm-diameter solid silica microspheres.

FIG. 13C shows the absorptivity/emissivity as a function of wavelength for a 55-µm-thick polymethylpentene film with 5% volumetric fraction of 8-µm-diameter solid silica microspheres. The net day-time cooling power is 113 W/m$^2$ with <4% averaged solar absorptivity and >0.8 IR emissivity on average. Percentages of fillers given in FIGS. 13A-13C are by volume.

Figure 14:
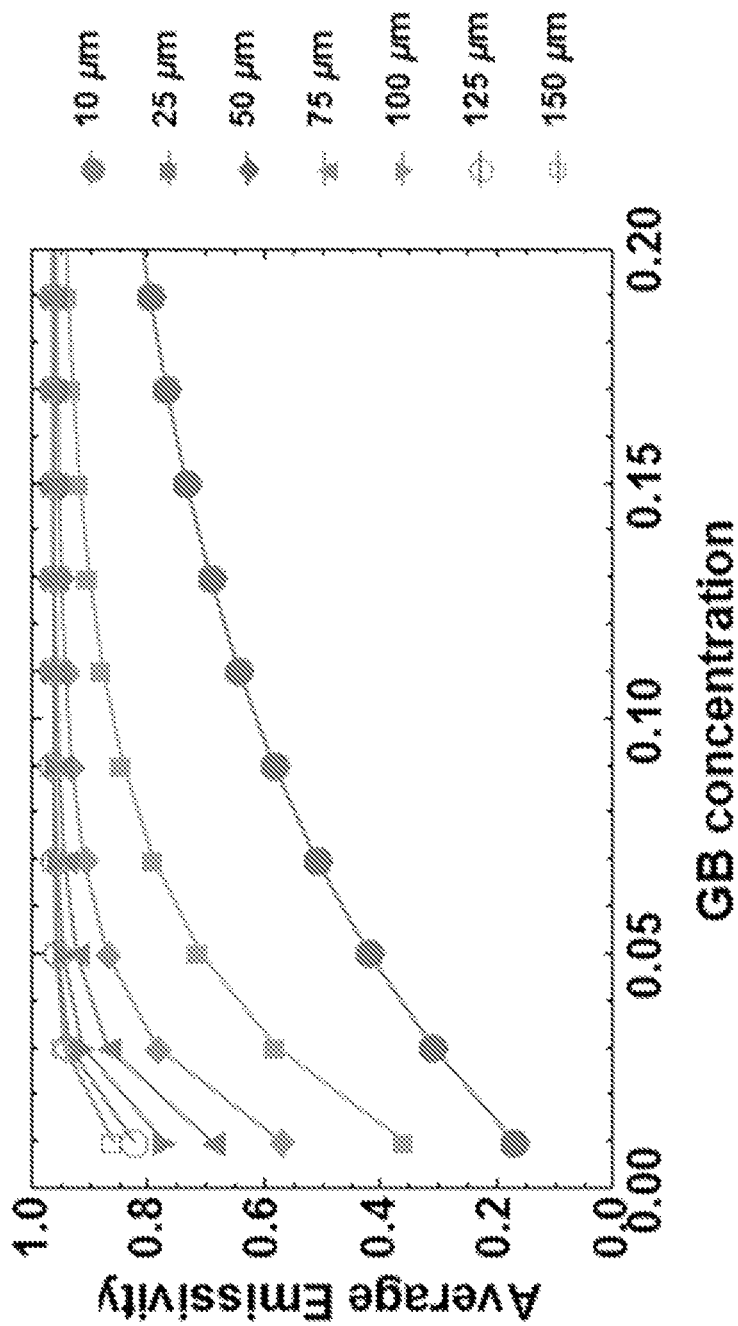
FIG. 14: illustrates the emissivity as a function of glass bead concentration (volume fraction) for different size beads.

FIG. 14 shows the projected radiative cooling power of an emissive layer with a reflective layer. The emissive layer includes a polymer sheet with embedded dielectric spheres according to different volume ratios of embedded spheres and film thicknesses.

Example 2: Scalable-Manufactured Randomized Glass-Polymer Hybrid Metamaterial for Day-time Radiative Cooling Passive radiative cooling draws heat from surfaces and radiates it into space as infrared radiation to which the atmosphere is transparent. However, the energy density mismatch between solar irradiance and the low infrared radiation flux from a near-ambient-temperature surface require materials that strongly emit thermal energy and barely absorb sunlight. We embedded resonant polar dielectric microspheres randomly in a polymeric matrix, resulting in a metamaterial that is fully transparent to the solar spectrum while having an infrared emissivity greater than 0.93 across the atmospheric window. When backed with silver coating, the metamaterial shows a noon-time radiative cooling power of 93 W/m$^2$ under direct sunshine. More critically, we demonstrated high-throughput, economical roll-to-roll manufacturing of the metamaterial, vital for promoting radiative cooling as a viable energy technology.

Radiative cooling—deposition of blackbody radiation from a hot object through the infrared transparency window of the atmosphere to the cold sink of outer space—is an appealing concept for the 21st century, where most daily necessities, from power generation to data centers, generate excess heat. In contrast to most of the currently employed cooling methods which require energy and resources to carry heat away, radiative cooling is a passive enhancement of the earth's natural method of cooling itself. Efficient nighttime radiative cooling systems have been extensively investigated in the past, with promising infrared-emissivity in both organic and inorganic materials including pigmented paints (1-5). Day-time radiative cooling, however, presents a different challenge because solar absorbance of just a few percent exceeds the cooling power and effectively heat the surface. Proposed nanophotonic devices can effectively reject solar irradiance but emit strongly in infrared (6-7), promising for day-time radiative cooling. However, the nanophotonic approach requires stringent, nanometer-precision fabrication, which is difficult to scale up cost-effectively to meet the large area requirements of the residential and commercial applications that can benefit most from radiative cooling.

Polymeric photonics is a growing field attractive for economy and scalability (8-11). Hybridization of random optical metamaterials with polymer photonics can be a promising approach for efficient day-time radiative cooling—To date harnessing randomness in photonic systems has yielded amplified spontaneous emission (12,13), extremely localized electromagnetic hotspots (14-16), improved light-trapping efficiency of photovoltaic cells (17, 18), and negative permeability and switching devices with multi-stability (19,20). When electromagnetic resonators in a random metamaterial are collectively excited, the extinction and the optical path length in the material are both enhanced, resulting in nearly perfect absorption at the resonance (21,22). This implies the great potential for utilizing metamaterials with randomly distributed optical resonators for effective radiative cooling if perfect absorption (emissivity) across the entire atmospheric transmission window can be achieved.

Provided herein are efficient day- and nighttime radiative cooling methods and devices with a randomized, glass-polymer hybrid metamaterial. In an embodiment, the metamaterial consists of a visibly transparent polymer encapsulating randomly distributed silicon dioxide ($SiO_2$) microspheres. The spectroscopic response spans two orders of magnitude in wavelength (0.3 to 25 μm). The hybrid metamaterial is extremely emissive across the entire atmospheric transmission window (8-13 μm) due to phonon-enhanced Fröhlich resonances of the microspheres. A 50-μm-thick metamaterial film containing 6% of microspheres by volume has an averaged infrared emissivity >0.93 and reflects approximately 96% of solar irradiance when backed with a 200-nm-thick silver coating. We experimentally demonstrate an average noon-time (11 am-2 pm) radiative cooling power of 93 W/m² under direct sunshine during a three-day field test, and an average cooling power >110 W/m² over the continuous 72-hour day and night test. The metamaterial was fabricated in 300-mm-wide sheets at a rate of 5 m/min, such that in the course of experiment we produced hundreds of square meters of the material.

Figure 15A:
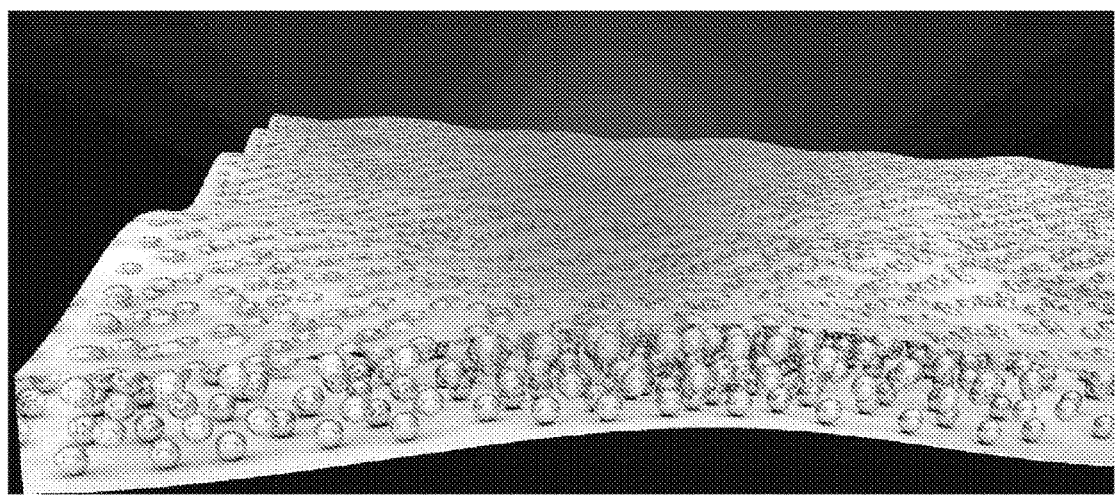
(FIG. 15A) A schematic of the polymer-based hybrid metamaterial with randomly distributed $SiO_2$ microsphere inclusions for large-scale radiative cooling. The polarizable microspheres interact strongly with infrared light, making the metamaterial extremely emissive across the full atmospheric transmission window while remaining transparent to the solar spectrum.

The structure of the randomized, glass-polymer hybrid metamaterial described in this example contains micrometer-sized $SiO_2$ spheres randomly distributed in the matrix material of polymethylpentene (TPX) (FIG. 15A). TPX was used due to its excellent solar transmittance. Other visibly transparent polymers such as Poly(methyl methacrylate) and polyethylene can be used. Because both the polymer matrix material and the encapsulated $SiO_2$ microspheres are lossless in the solar spectrum, absorption is nearly absent and direct solar irradiance does not heat the metamaterial.

Figure 15B:
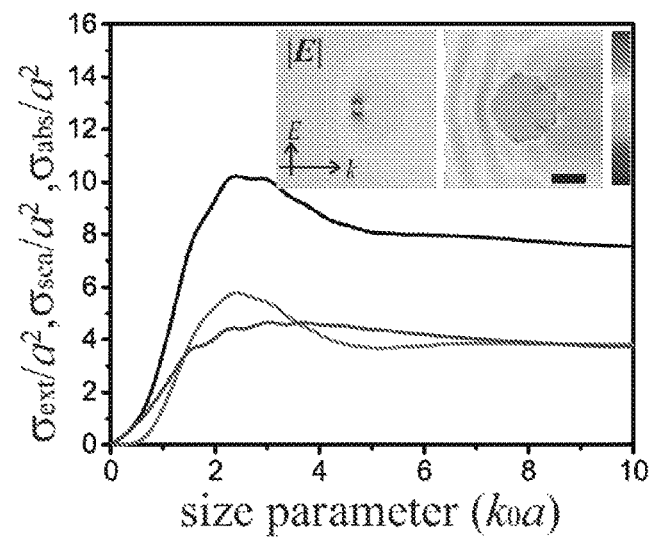
(FIG. 15B) Normalized absorption (blue), scattering (red), and extinction (black) cross-sections of individual microspheres as functions of size parameter ($k_0a$). The extinction, the sum of the scattering and absorption, peaks at a size parameter of 2.5, which corresponds to a microsphere radius of 4-μm. The inset shows the electric field distributions of two microspheres with 1- and 8-μm diameters, illuminated at a 10-μm wavelength. The scale bar is 4 μm. The smaller microsphere resonates at the electric dipolar resonance while higher order electric and magnetic modes are excited in the larger microsphere.
Figure 15C:
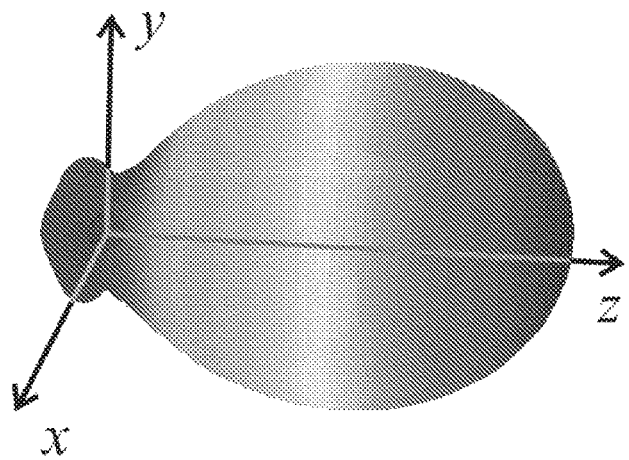
(FIG. 15C) Angular diagram for the scattering far-field irradiance of an 8-μm-diameter microsphere with 10-μm wavelength illumination. The incident field is polarized along the y-direction and propagating along the z-direction.

At infrared wavelengths, the encapsulated $SiO_2$ microspheres have drastically different optical properties than that of the surrounding matrix material due to the existence of strong phonon-polariton resonances at 9.7 μm (23). We calculated the normalized absorbance ($\sigma_{abs}/a^2$), scattering ($\sigma_{sca}/a^2$), and extinction ($\sigma_{ext}/a^2$) cross-sections of an individual microsphere encapsulated in TPX as a function of its size parameter, $k_0a$, for an incident wavelength of 10 μm (FIG. 15B). Here $k_0$ is the wavevector in free space and a is the radius of the microsphere. The extinction peaks at a size parameter of ~2.5, corresponding to a microsphere radius of ~4 μm. The size parameter of the microsphere plays a key role in designing the hybrid metamaterial for radiative cooling. At the small particle (quasi-static) limit, the resonance is purely electric-dipolar in character (FIG. 15B inset). At the extinction peak, high-order Fröhlich resonances including both electric and magnetic modes are also strongly excited, which is evidenced by the strong forward scattering shown in FIG. 15C, the three-dimensional power scattering function (far-field scattering pattern) (24).

Figure 16A:
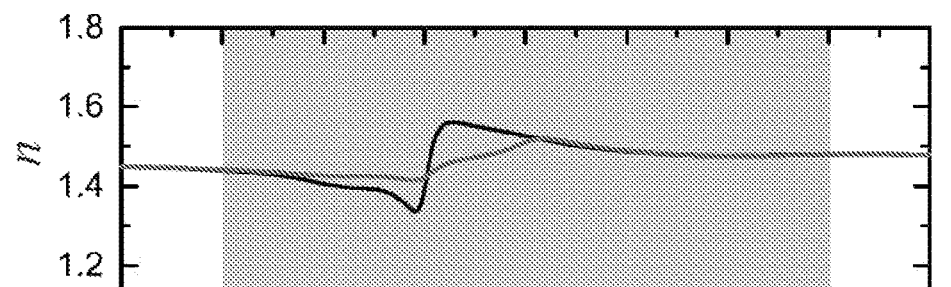
FIG. 16 Fröhlich resonance and broadband infrared absorbance of the hybrid metamaterial. The real (FIG. 16A) and imaginary (FIG. 16B) part of the effective refraction index for the glass-polymer hybrid metamaterials. The metamaterial with 1-μm-diameter $SiO_2$ microspheres (black curves) shows a strong Fröhlich resonance at its phonon-polariton frequency of 9.7 μm, while the metamaterial with 8-μm-diameter microspheres (red curves) shows significantly more broadband absorption across infrared wavelengths. The strong Fröhlich resonance not only limits the bandwidth of strong emissivity but also introduces strong reflectance of incident infrared radiation. In both cases, the metamaterial contains 6% $SiO_2$ by volume.
(FIG. 16C) The attenuation lengths of the two hybrid metamaterials, with the 8-μm-diameter $SiO_2$ microsphere case showing an average attenuation length of ~50 μm from $\lambda$=7 to 13 μm.
Figure 16B:
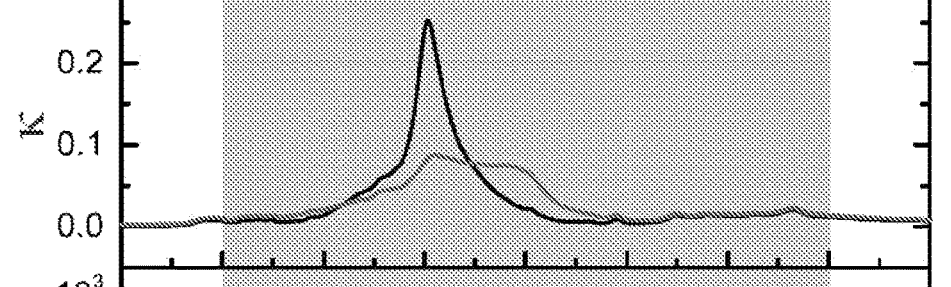
Figure 16C:
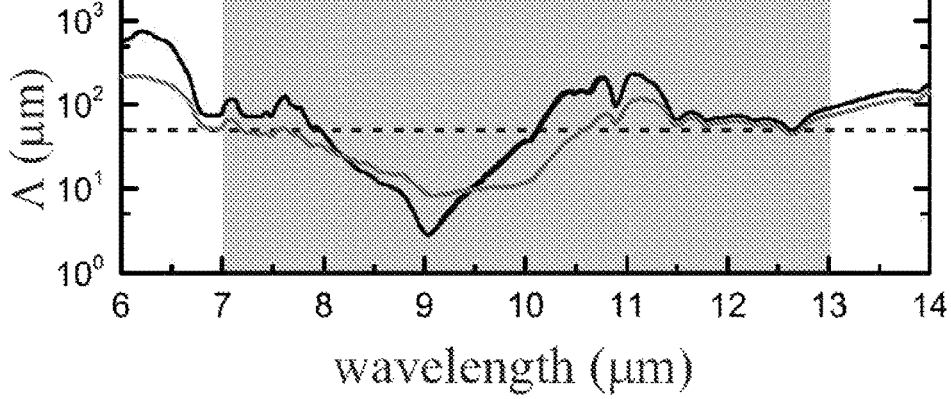

The intrinsically narrow linewidth of phonon-polaritons, often a superior advantage in the applications such as infrared sensing (25,26), can limit here the bandwidth of the highly emissive infrared region. We obtained broadband emissivity across the entire atmospheric window by accessing the high-order Fröhlich resonances of the polar dielectric microspheres (27). The real and the imaginary parts of the extracted effective index of refraction, $n+i\kappa=\sqrt{\varepsilon_{eff}\cdot\mu_{eff}}$, are functions of wavelength and microsphere sizes, as illustrated in FIG. 16 for 1- and 8-μm-diameter microspheres. Given the low concentration (6% by volume) and assuming that the microspheres are uniform in size and distribution, we retrieved the effective permittivity and permeability of the hybrid metamaterial from $\varepsilon_{eff}=\varepsilon_p\cdot[1+i\gamma(S_0+S_1)]$, and $\mu_{eff}=1+i\gamma(S_0-S_1)$, respectively (28), where $S_0$ and $S_1$ are the forward and backward scattering coefficients of an individual microsphere in the encapsulating medium, and the factor γ incorporates the volume fraction, f, and the size parameter, $$k_0a\left(\gamma=\frac{3f}{2(k_0a)^3}\right).$$

in the case of large microspheres, modal interference between higher order modes makes the hybrid metamaterial strongly infrared-absorbing. Importantly, it becomes nearly dispersionless in the infrared. The dispersion of both the real and imaginary part of the effective index of refraction is less than $9\times10^{-5}$/nm across the entire infrared wavelength range (FIG. 16), in stark contrast to the strong dispersion of polar, dielectric bulk $SiO_2$, $\sim5\times10^{-3}$/nm in this same range. The low dispersion provides excellent broadband impedance matching of the metamaterial to free space, resulting in extremely low reflectance for both solar and infrared radiation. A hybrid metamaterial as thin as 50-μm can provide uniform and sufficiently strong absorbance across the entire atmospheric window, resulting in perfect broadband infrared emission for radiative cooling (FIG. 16C). In contrast, when the microspheres are small ($k_0a<<1$), a sharp resonance occurs (FIG. 16B), which limits the high infrared emissivity to the polariton resonance wavelength only. Moreover, the resonance introduces strong reflectance, further reducing the overall emissivity.

Figure 17A:
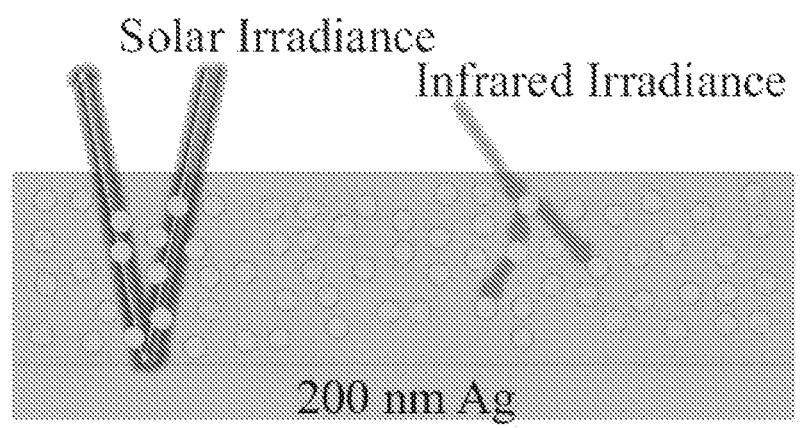
(FIG. 17A) Schematic of the hybrid metamaterial backed with a thin silver film. The silver film diffusively reflects most of the incident solar irradiance while the hybrid material absorbs all incident infrared irradiance and is highly infrared emissive.
Figure 17B:
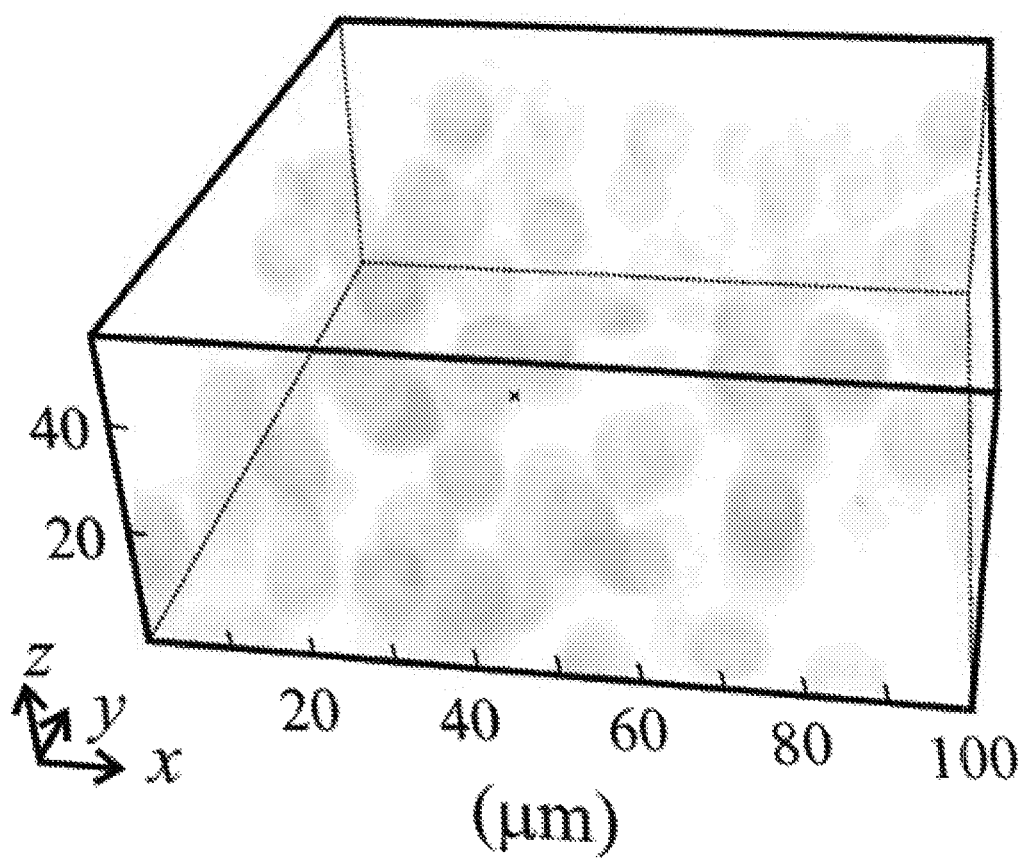
(FIG. 17B) Three-dimensional confocal microscope image of the hybrid metamaterial. The microspheres are visible due to the autofluorescence of $SiO_2$.
Figure 17C:
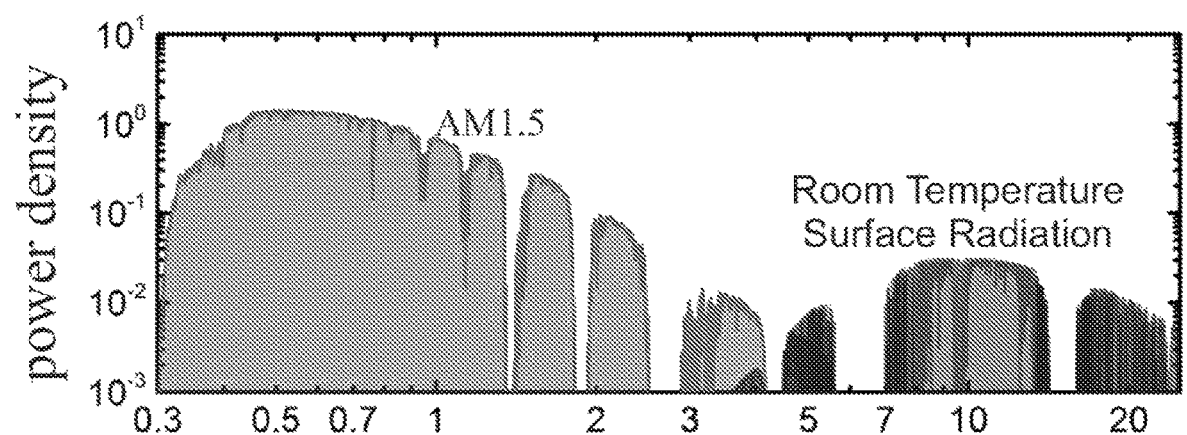
(FIG. 17C) Power density of spectral solar irradiance (AM1.5) and thermal radiation of a blackbody at room temperature. The sharply varying features in both spectra are due to the absorbance of the atmosphere (gas molecules). The radiative cooling process relies on strong emission between 8 and 13 μm, the atmospheric transmission window.
Figure 17D:
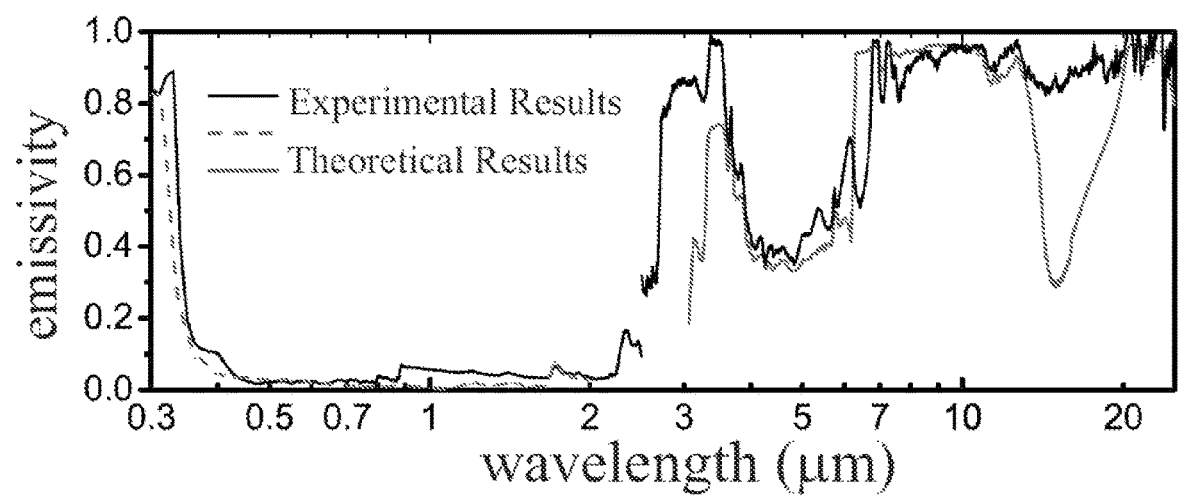
(FIG. 17D) The measured emissivity/absorptivity (black curve) of the 50-μm-thick hybrid metamaterial from 300 nm to 25 μm. Integrating spheres are employed for the measurement of both solar (300 nm to 2.5 μm) and infrared (2.5 μm to 25 μm) spectra. Theoretical results for the same hybrid metamaterial structure (red curves) are plotted for comparison. Two different numerical techniques, RCWA and incoherent transfer matrix methods, are employed for the solar and infrared spectral ranges, respectively.

The hybrid metamaterial strongly reflects solar irradiation when backed with a 200-nm-thick silver thin film (FIG. 17A) prepared by electron beam evaporation. We characterized the spectroscopic performance of the metamaterial thin film in both the solar (0.3 μm to 2.5 μm) and infrared (2.5 μm to 25 μm) regions using a UV-VIS-NIR spectrophotometer and Fourier transform infrared spectrometer (FTIR), respectively (FIG. 17C and FIG. 17D). We used integrating spheres to account for the scattered light from the full solid angle in both spectral regions. The measured spectral absorptivity (emissivity) of the sample (FIG. 17D) indicates that the 50-μm-thick film reflects ~96% solar irradiation while possessing a nearly saturated emissivity >0.93 between 8 and 13 μm—yielding greater than 100 W/m² radiative cooling power under direct sunlight at room temperature. The experimental results agree well with theory, where the spectroscopic discrepancies near 3 and 16 μm wavelengths primarily due to the absorbance of water and air during the FTIR measurement in ambient conditions. We must employ different theoretical approaches for calculating the emissivity in the solar and infrared wavelength ranges. We used the generalized, incoherent transfer-matrix method in the infrared region (29). In the solar region, we instead used rigorous coupled wave analysis (RCWA) because the extracted effective parameters of the metamaterial are inaccurate when the size of the microsphere is greater than the relevant wavelengths (30). We note that the high emissivity in the second atmospheric window between 16 and 25 μm might be harnessed for additional radiative cooling (31).

Using a polymer as the matrix material for radiative cooling has the advantages of being lightweight and easy to laminate on curved surfaces. It can accommodate small variations in microsphere size and shape with negligible impact on the overall performance. TPX has excellent mechanical and chemical resistance, offering potentially long lifetimes for outdoor use. However, one of the most compelling advantages of developing a glass-polymer hybrid metamaterial lies in the possibility of cost-effective scalable fabrication. A roll of 300-mm-wide and 50-μm- thick hybrid metamaterial film may be produced at a rate of 5 m/min (FIG. 18A). Control of the volume concentration of the $SiO_2$ microspheres may be accomplished by using gravimetric feeders. The resultant film has a homogeneous distribution of microspheres, with fluctuations in concentration of less than 0.4% (32) (FIG. 19). The hybrid metamaterial films are translucent due to the scattering of visible light from the microsphere inclusions (FIG. 20). Additionally, when backed with a 200-nm-thick reflective silver coating, the hybrid metamaterial has a balanced white color (32) (FIG. 20). The strongly scattering and nonspecular optical response of the metamaterial will avoid back-reflected glare, which can have detrimental visual effects for humans and interfere with aircraft operations (33).

Figure 21A:
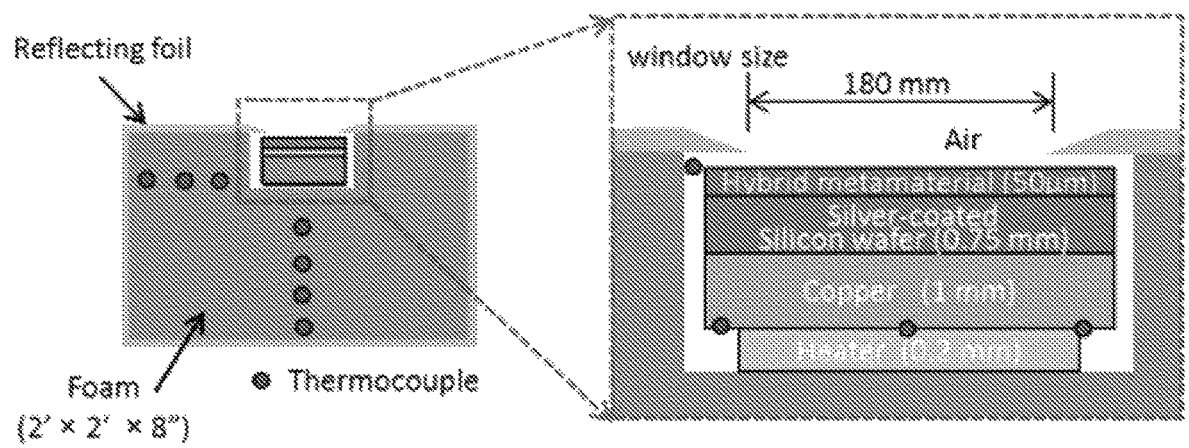
FIG. 21A. Schematic of the direct thermal measurement apparatus with a feedback-controlled electric heater. The closed-loop electronics tracks the metamaterial surface temperature to be the same as that of the ambient environment, minimizing convective and conductive heat losses. This feedback-controlled measurement apparatus allows us to remove the HDPE protective film and let the hybrid metamaterial be directly exposed to the air for 24/7 continuously, with accurate measurement of the radiative cooling power.
Figure 21B:
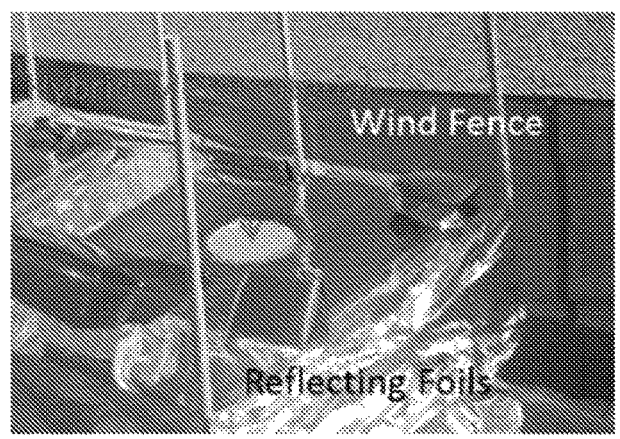
(FIG. 21B) Photo of the experimental setup during operation.
Figure 24A:
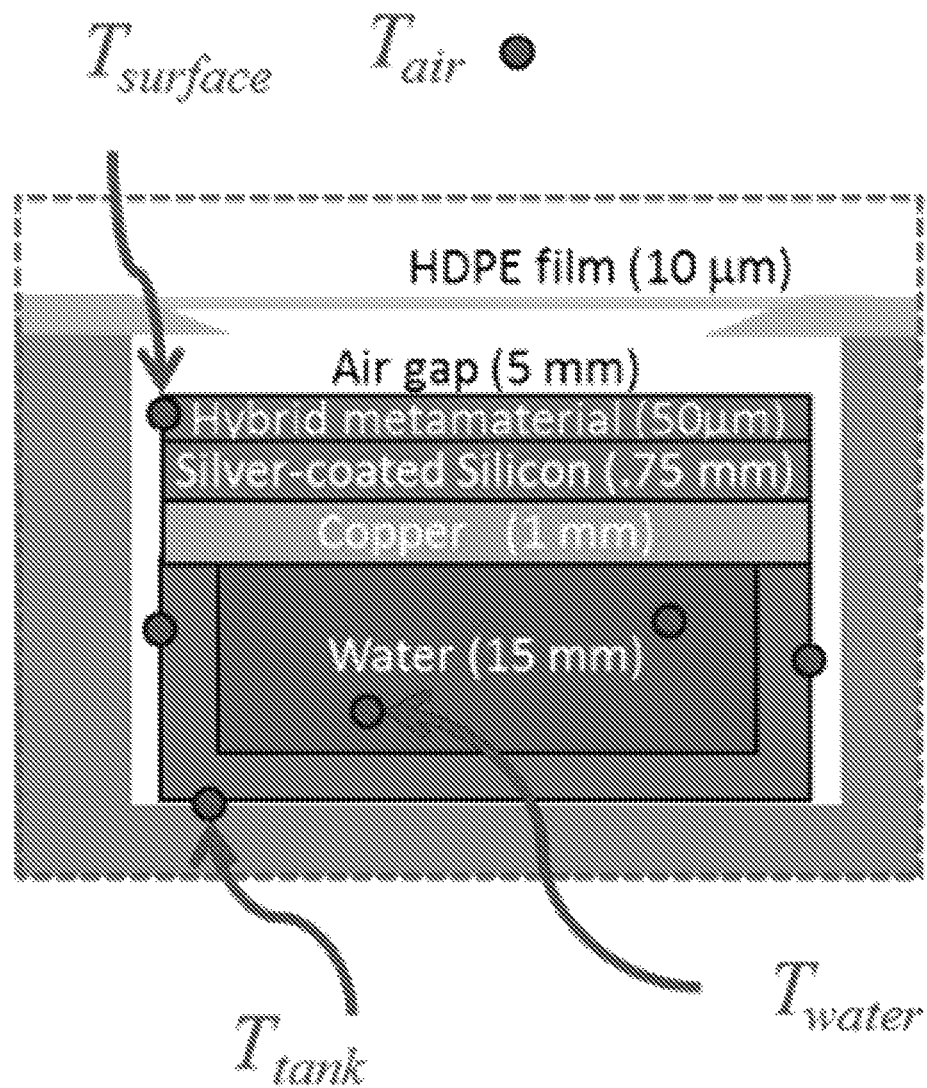
(FIG. 24A) Schematic for the setup.

Real-time, continuous radiative cooling is demonstrated by conducting thermal measurements using an 8-inch-diameter, scalably-fabricated hybrid metamaterial film over a series of clear autumn days in Cave Creek, Ariz. (33°49'32"N, 112°1'44"W, 585 m altitude) (FIG. 18B, 18C). The metamaterial was placed in a foam container that prevents heat loss from below. The top surface of the metamaterial faced the sky and was directly exposed to the air (32) (FIG. 21). The surface temperature of the metamaterial was kept the same as the measured ambient temperature using a feedback-controlled electric heater placed in thermal contact with the metamaterial to minimize the impacts of conductive and convective heat losses. The total radiative cooling power is therefore the same as the heating power generated by the electric heater if there is no temperature difference between the surface and the ambient air. With the feedback control, the surface temperature follows the measured ambient temperature within ±0.2° C. accuracy during the day and less than ±0.1° C. at night (32) (FIG. 22). Continuously measuring radiative cooling power gives an average radiative cooling power >110 $W/m^2$ over a continuous 72-hr day-/nighttime measurement (FIG. 18C). The average cooling power around noon reaches 93 $W/m^2$ with normal-incidence solar irradiance greater than 900 $W/m^2$. We observed higher average nighttime radiative cooling than during the day. However, the cooling power peaks after sunrise and before sunset when the ambient temperature is changing rapidly and solar irradiance is incident at large oblique angles. To further demonstrate the effectiveness of radiative cooling, we also used water as cold storage medium and show cold water production with the scalably-fabricated hybrid metamaterial (32) (FIG. 24). Applying chemical additives and high-quality barrier coatings may enhance their outdoor performance including lifetime and reliability. Many polymeric thin films are currently available and designed with extended outdoor lifetime (34).

Supplementary Text
Distribution of Microspheres in the Polymer Matrix

Figure 19A:
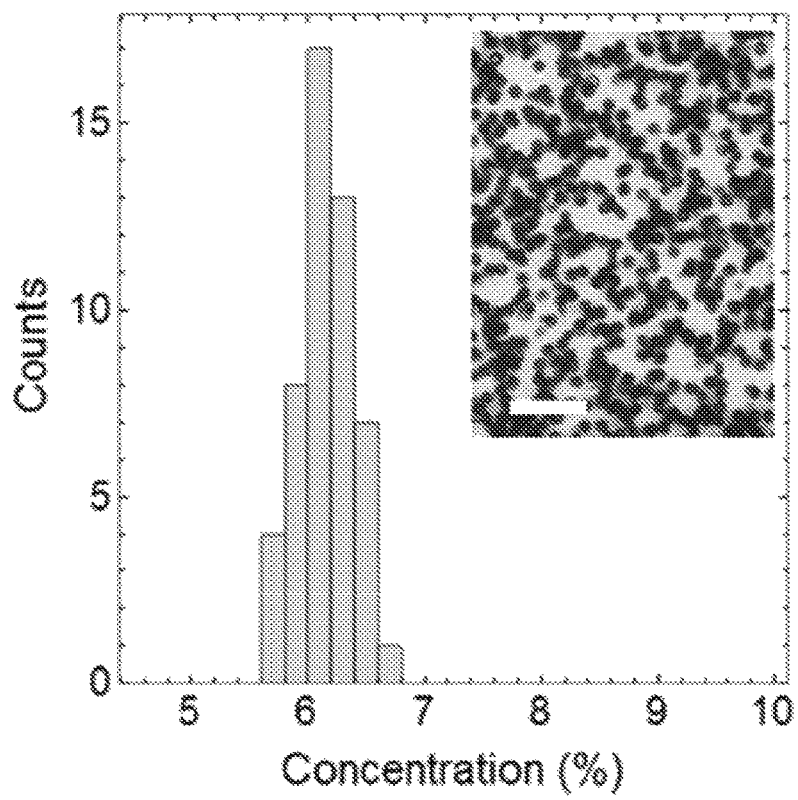
FIG. 19A. The edge-to-edge concentration distribution of the silica microspheres in the 300-mm-wide metamaterial. The concentration variation is less than 0.4%. The inset shows an optical image of the metamaterial thin film. Scale bar: 40 μm.
Figure 19B:
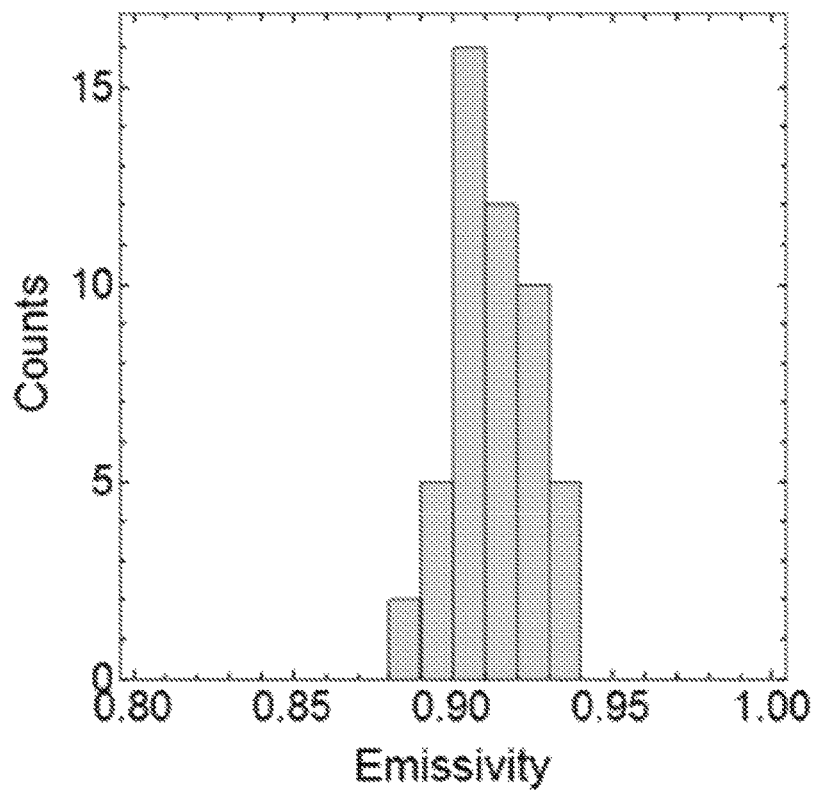
(FIG. 19B) Averaged emissivity distribution of all samples corresponding to the distribution in (FIG. 19A).

The uniformity of the silica microsphere distribution in the polymer matrix was quantified, and it was shown that the edge-to-edge uniformity was achieved for the 300-mm-wide metamaterial thin films. As shown in FIG. 19A, the concentration variation is less than 0.4%, and the corresponding emissivity variation is even less (FIG. 19B).

Optical Diffusivity of the Hybrid Metamaterial

Figure 20A:
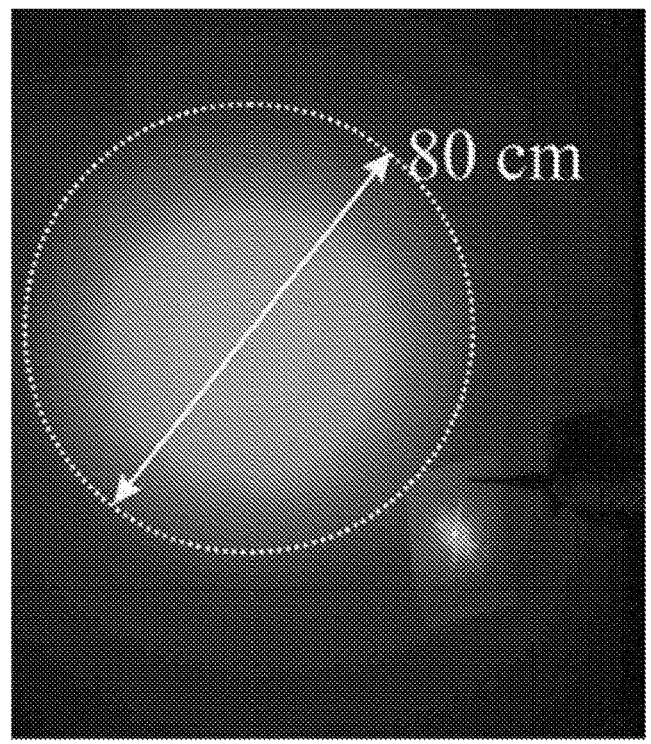
FIG. 20A. Photo showing the light-scattering effect of the translucent hybrid metamaterial. A 2-mm-diameter laser beam at a wavelength of 532 nm is greatly dispersed when transmitted through the film.
Figure 20B:
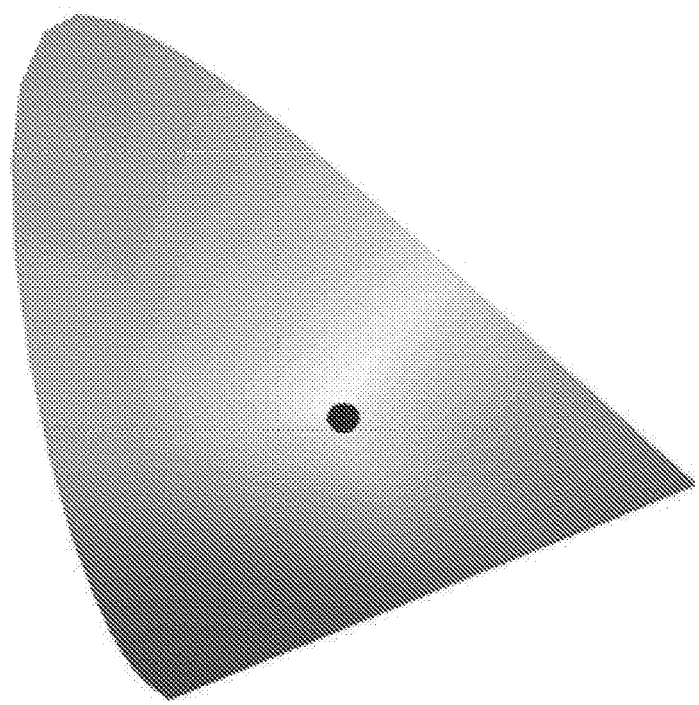
(FIG. 20B) Chromaticity analysis of the metamaterial. The color of the hybrid metamaterial is centered in the color space (white-balanced) as a result of the strong scattering effect of visible light by the microspheres.

An inherent beneficial attribute of the glass-polymer hybrid metamaterial is optical diffusivity. We showed this optical characteristic by shining a simple laser pen at a wavelength of 532 nm through the film approximately 1 m away from a wall. Scattering of the 2-mm beam within the 50-μm sample results in an 80 cm diameter at the wall (FIG. 20A). We further analyzed the visible appearance of the sample, when backed by a silver film by chromaticity analysis, and found it to be a pure balanced white color (FIG. 20B).

Direct Thermal Measurement of Radiative Cooling Power with Feedback-Controlled Electric Heater Large temperature differences observed between the metamaterial and the ambient air can induce severe convective and conductive heat losses in an open environment, particularly during the day when the ambient temperature fluctuation is large. Given the complexity of heat exchange with varying boundary conditions and stochastic environmental parameters such as forced convection by wind, we implemented a feedback-controlled system to keep the metamaterial surface temperature the same as the ambient temperature and accurately assess the true radiative cooling power. The measurement uncertainty due to convective and conductive heat exchange between ambient air and the metamaterial was therefore substantially suppressed. It allowed us to remove the top HDPE protective film and perform direct thermal measurement with the hybrid metamaterial fully exposed to the air (see the apparatus, FIG. 21)—a preferred configuration for practical applications.

As shown in FIG. 22A, the surface temperature of the metamaterial tightly follows the ambient air temperature during both day- and nighttime hours. The inset shows the dynamic behavior when the feedback loop was switched on. The integral time constant is about 5 min, and the temperature difference between the ambient and the metamaterial surface can be brought and maintained below 0.2° C. within 30 min. The temperature difference between ambient and the surface of metamaterial over the same period of 18 hours is shown in FIG. 22B. The peak temperature difference was less than ±1° C. during the entire course of experiment. The occasional sudden jumps in temperature were mainly due to gusty wind, from which it took the feedback system approximately 30 min to reestablish tracking. The histograms of the temperature difference between the ambient and the metamaterial surface are shown in FIG. 22C and D for day- and nighttime, respectively. Considering the natural convection of ~5 $W/(m^2·K)$ and conduction at the air-metamaterial interface under such a small temperature difference, the electric heating power applied through the feedback electronics accurately measures the real-time radiative cooling power.

With the feedback-controlled direct thermal measurement apparatus, we measured the radiative cooling power of the hybrid metamaterial over a series of clear autumn days in Cave Creek, Ariz. (33°49'32"N, 112°1'44"W, 585 m altitude). A consecutive three-day measurement is presented in FIG. 18. We demonstrated a 72-hr average cooling power >110 $W/m^2$ and a noon-time (11 am-2 pm) average cooling power of 93 $W/m^2$.

Figure 23A:
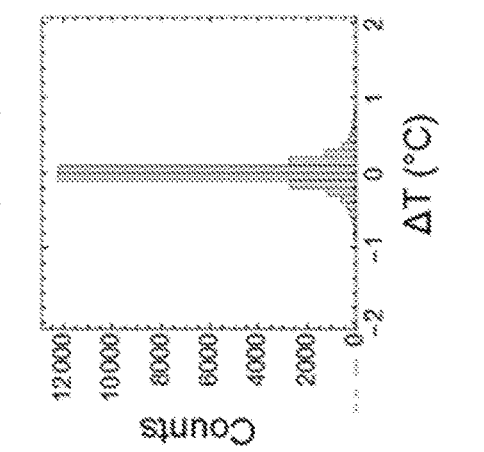
FIG. 23A. Continuous measurement of the surface (red) and ambient temperature (black) temperature using with electronic feedback control.
Figure 23B:
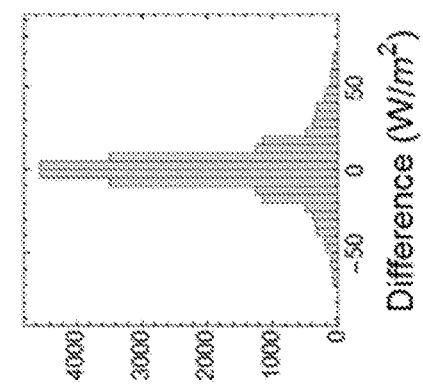
(FIG. 23B) Distribution of the temperature difference between the surface and the ambient temperature over 24 hours.
Figure 23C:
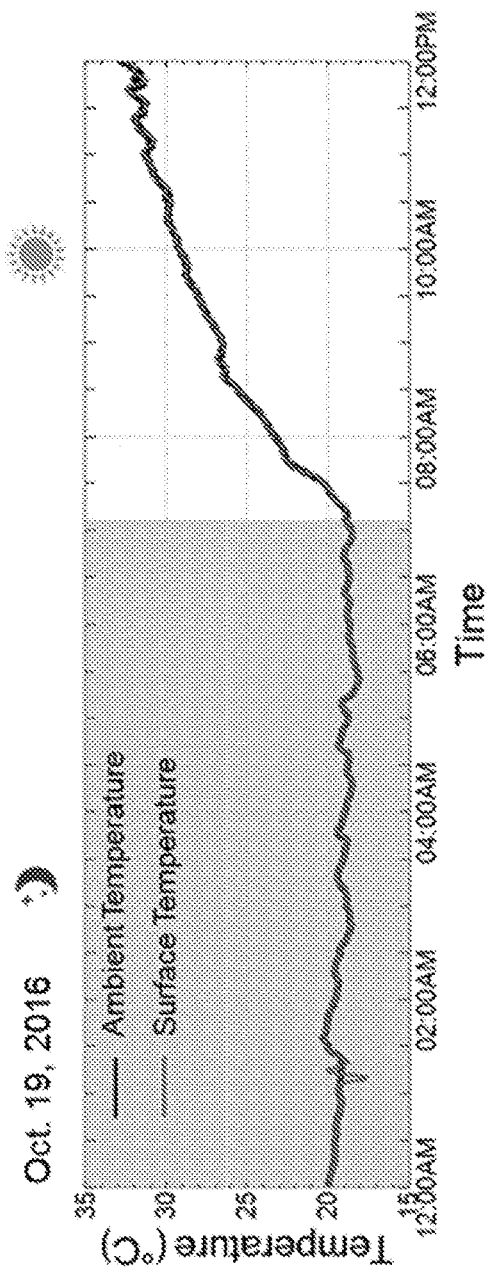
(FIG. 23C) Continuously measured cooling power (sampled at 1 sec) and its run-time average value (averaged over 5 min). There are momentary oscillations, shown in grey, for the real-time data due to the feedback control circuit.
Figure 23D:
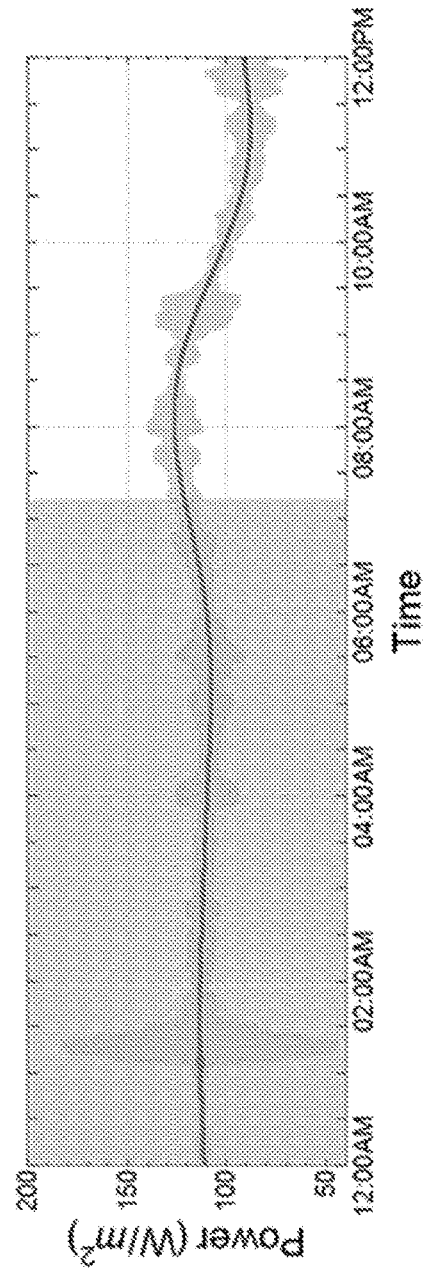
(FIG. 23D) Distribution of the difference between the instantaneously measured cooling power and its run-time average value. The measurement error is less than 10 watts and the momentary oscillation clearly overestimates the error in real-time power measurement.

The measurement error of the radiative cooling power is less than 10 $W/m^2$ as defined by the histogram width reflecting 24-hr continuous measurement—and this is in fact overestimated due to the nature of the feedback controlled measurement system. As shown in FIG. 23A and FIG. 23B, the feedback controlled system causes the metamaterial surface temperature to trace the ambient temperature. The mismatch between the two temperatures is much less than 1° C. over the 24-hr period. In FIG. 23C, we show the instantaneous power and the time-averaged power, and the histogram of the difference is shown in FIG. 23D. Momentary oscillations in the feedback control loop cause the measurement error of cooling power to appear incorrectly large. For this reason, we therefore characterize the hybrid metamaterial using its run-time average value for the cooling power.

Direct Cooling of Water

Figures 24B, 24C:
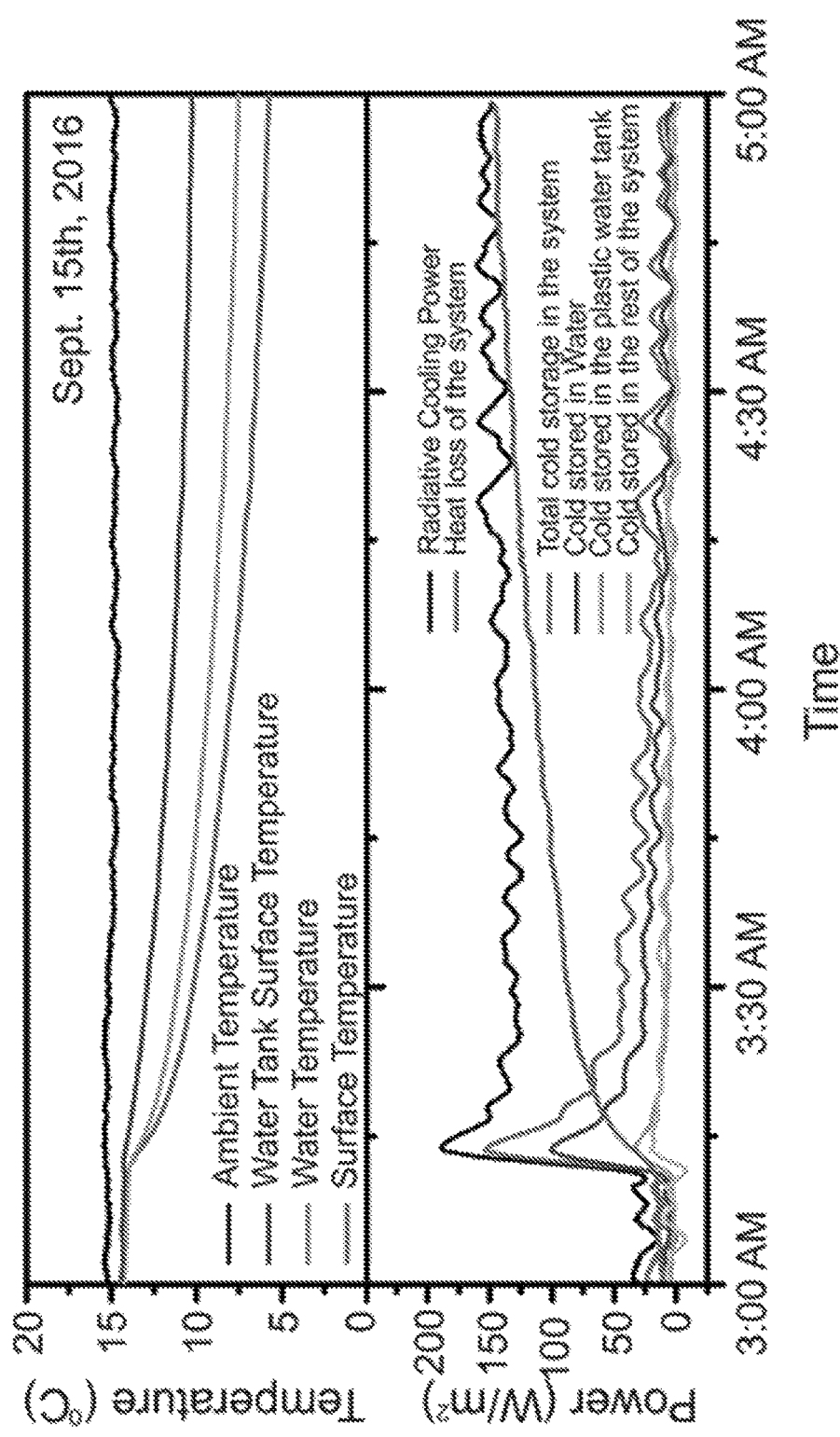
(FIG. 24B) The ambient temperature (Black), water tank surface temperature (Blue), water temperature (Green), and the metamaterial surface temperature (Red) as functions of time. At 3:10 am on Sep. 15, 2016, the metamaterial was exposed to the sky.
(FIG. 24C) The transient analysis of the cold energy stored in the water (Blue), the plastic water tank (Green), the stacked structure, including the metamaterial, silver-coated wafer, and the copper plate (Cyan), and the summation of the three (Red). The total convective and conductive heat loss (Magenta) through the Polystyrene foam box increased with the increasing temperature differences between the enclosure and ambient air. The total heat capacity is about 33 KJ/(m$^2$·K). The total radiative cooling power of the metamaterial (Black) is the sum of the heat loss and the cold stored in all materials, which was approximately 120 W/m$^2$. The overshoot in the measured radiative cooling power at the beginning of the measurement was due to non-steady heat flows between the components of the measurement system.

We further demonstrate the effectiveness of radiative cooling for a relatively large thermal mass using water as a cold storage medium. The experimental setup is outlined in FIG. 24A. A plastic water tank was placed underneath the radiative cooling glass-polymer hybrid metamaterial, putting water in close contact with the heat-conducting copper plate. Since the water is stationary in the experiment, its large heat capacity substantially slows down the cooling process. We therefore used a 10-µm-thick HDPE film on top of the Polystyrene foam box in this setup to reduce convective heat loss and improve thermal isolation. FIG. 24B shows the ambient temperature ($T_{air}$), the water tank surface temperature ($T_{tank}$), the water temperature ($T_{water}$), and the surface temperature of the metamaterial ($T_{surface}$) as functions of time after we exposed the hybrid metamaterial to a clear sky at 3:10 am. The water temperature continuously dropped, reaching more than 8° C. below ambient after two hours of exposure.

Based on the temperature change, we calculated the amount of heat stored in each material involved in the experiment, including the water, the plastic water tank, and the material stack including the hybrid metamaterial, silver-coated silicon wafer, and the copper plate, as shown in FIG. 24C, as functions of time. FIG. 24C also shows the heat loss from the Polystyrene foam box and the total radiative cooling power, which is the summation of the heat loss and the total heat stored in all materials. The results once again demonstrated a radiative cooling power of more than 100 W/m² during the night, and, more importantly, the effectiveness of the radiative cooling by a low-cost, scalably-manufactured glass-polymer hybrid metamaterial for cold water production, which could have applications in cooling of buildings, data centers and even thermoelectric power plants.

REFERENCES (1) S. Catalanotti, V. Cuomo, G. Piro, D. Ruggi, V. Silvestrini, G. Troise, The radiative cooling of selective surfaces, *Solar Energy,* 17, 83 (1975).
(2) C. G. Granqvist and A. Hjortsberg, Radiative cooling to low temperatures: General considerations and application to selectively emitting SiO films, *J. Appl. Phys.,* 52, 4205 (1981).
(3) B. Orel, M. Klanjšek Gunde, and Aleš Krainer, Radiative cooling efficiency of white pigmented paints, *Solar Energy,* 50, 477 (1993).
(4) A. R. Gentle, G. B. Smith, A Subambient Open Roof Surface under the Mid-Summer Sun, *Adv. Sci.,* 2, 1500119 (2015).
(5) Md. M. Hossain, M. Gu, Radiative Cooling: Principles, Progress, and Potentials, *Adv. Sci.,* 4, 1500360 (2016).
(6) E. Rephaeli, A. Raman, and S. Fan, Ultrabroadband photonic structures to achieve high-performance daytime radiative cooling, *Nano Letters,* 13, 1457 (2013).
(7) A. P. Raman, M. A. Anoma, L. Zhu, E. Rephaeli, and S. Fan, Passive radiative cooling below ambient air temperature under direct sunlight, *Nature,* 515, 540 (2014).
(8) M. F. Weber, C. A. Stover, L. R. Gilbert, T. J. Nevitt, A. J. Ouderkirk, Giant Birefringent Optics in Multilayer Polymer Mirrors, *Science* 287, 2451 (2000).
(9) S. D. Hart, G. R. Maskaly, B. Temelkuran, P H. Prideaux, J. D. Joannopoulos, Y. Fink, External Reflection from Omnidirectional Dielectric Mirror Fibers, *Science* 296, 510 (2002).
(10) J. K. Gansel, M. Thiel, M. S. Rill, M. Decker, K. Bade, V. Saile, G. von Freymann, S. Linden, M. Wegener, Gold Helix Photonic Metamaterial as Broadband Circular Polarizer, *Science* 325, 1513 (2009).
(11) R. D. Rasberry, Y. J. Lee, J. C. Ginn, P. F. Hines, C. L. Arrington, A. E. Sanchez, M. T. Brumbach, P. G. Clem, D. W. Peters, M. B. Sinclair, S. M. Dirk, Low loss photo-patternable matrix materials for LWIR-metamaterial applications, *Journal of Materials Chemistry,* 21, 13902 (2011).
(12) H. E. Türeci, L. Ge, S. Rotter, and A. D. Stone, Strong Interactions in Multimode Random Lasers, *Science,* 320, 643 (2008).
(13) D. S. Wiersma, The physics and applications of random lasers, *Nature Phys.* 4, 359 (2008).
(14) S. Gresillon, L. Aigouy, A. C. Boccara, J. C. Rivoal, X. Quelin, C. Desmarest, P. Gadenne, V. A. Shubin, A. K. Sarychev, and V. M. Shalaev, Experimental observation of localized optical excitations in random metal-dielectric films, *Phys. Rev. Lett.* 82, 4520 (1999).
(15) L. Sapienza, H. Thyrrestrup, S. Stobbe, P. D. Garcia, S. Smolka, and P. Lodahl, Cavity quantum electrodynamics with Anderson-localized modes, *Science,* 327, 1352 (2010).
(16) M. Segev, Y. Silberberg, and D. N. Christodoulides, Anderson localization of light, *Nature Photonics* 7, 197 (2013).
(17) E. Yabolonovinch, Statistical ray optics, *J. Opt. Soc. Am.* 72, 899 (1982).
(18) H. A. Atwater, and A. Polman, Plasmonics for improved photovoltaic devices, *Nature Materials* 9, 205 (2010).
(19) B. J. Seo, T. Ueda, T. Itoh, and H. Fetterman, Isotropic left handed material at optical frequency with dielectric spheres embedded in negative permittivity medium, *Appl. Phys. Lett.,* 88, 161122 (2006).
(20) P. Jung, S. Butz, M. Marthaler, M. V. Fistul, Juha Leppakangas, V. P. Koshelets, and A. V. Ustinov, Multi-stability and switching in a superconducting metamaterial, *Nature Communications* 5, 3730 (2014).
(21) X. P. Shen, Y. Yang, Y. X. Zang, J. Q. Gu, J. G. Han, W. L. Zhang, and T. J. Cui, Triple-band terahertz metamaterial absorber: Design, experiment, and physical interpretation, *Appl. Phys. Lett.* 101, 154102, (2012).
(22) J. Hao, E. Lheurette, L. Burgnies, É, Okada, and D. Lippens, Bandwidth enhancement in disordered metamaterial absorbers, *Appl. Phys. Lett.* 105, 081102 (2014).
(23) E. D. Palik, Handbook of Optical Constants of Solids (Academic, Orlando, 1985)
(24) W. Liu, J. Zhang, B. Lei, H. Ma, W. Xie, and H. Hu, Ultra-directional forward scattering by individual core-shell nanoparticles, *Optics Express,* 22, 16178 (2014).
(25) N. Ocelic, and R. Hillenbrand, Subwavelength-scale tailoring of surface phonon polaritons by focused ion-beam implantation, *Nature Materials* 3, 606 (2004).
(26) I. Balin, N. Dahan, V. Kleiner, E. Hasman, Slow surface phonon polaritons for sensing in the midinfrared spectrum, *Appl. Phys. Lett.* 94, 111112 (2009).
(27) Y. Zhao, M. A. Belkin, and A. Alia, Twisted optical metamaterials for planarized ultrathin broadband circular polarizers, *Nature communications,* 3, 870 (2012).
(28) M. S. Wheeler, J. S. Aitchison, J. I. Chen, G. A. Ozin, and M. Mojahedi, Infrared magnetic response in a random silicon carbide micropowder, *Physical Review B,* 79, 073103 (2009).
(29) C. C. Katsidis, and D. I. Siapkas, General transfer-matrix method for optical multilayer systems with coher-

(30) L. F. Li, Use of Fourier series in the analysis of discontinuous periodic structures, *J. Opt. Soc. Am. A* 13, 1870 (1996).
(31) H. W. Yates, and J. H. Taylor, Infrared transmission of the atmosphere, No. NRL-5453, Naval Research Lab, Washington D.C., (1960).
(32) Materials and Methods can be found as Supplementary Materials on Science Online.
(33) X. H. Xua, K. Vignaroobanc, B. Xud, K. Hsua, A. M. Kannana, Prospects and problems of concentrating solar power technologies for power generation in the desert regions, *Renewable and Sustainable Energy Reviews,* 53, 1106 (2016).
(34) H. Price, E. Lupfert, D. Kearney, E. Zarza, G. Cohen, R. Gee, and R. Mahoney, Advances in parabolic trough solar power technology, *Journal of solar energy engineering,* 124, 109 (2002).

We claim:

1. A method for removing heat from a body by selective thermal radiation, the method comprising the steps of:
   a. placing a selective radiative cooling structure in thermal communication with a surface of the body, the selective radiative cooling structure comprising:
      a selectively emissive layer comprising a polymer and a plurality of dielectric particles dispersed in the polymer, the volume percentage of the dielectric particles in the selectively emissive layer selected from the range of 1% to 25% and the dielectric particles characterized by an average size range from 3 µm to 30 µm; and
      a reflective layer that is a silver film characterized by an average thickness from 20 nanometers to 300 nanometers, wherein the selectively emissive layer is provided on the reflective layer;
      wherein the selectively emissive layer is in thermal communication with the body, the selective radiative cooling structure is characterized by an average emissivity ranging from 0.5 to 1.0 over the wavelength range 7 µm to 14 µm, and the selectively emissive layer has a transmissivity of 0.7 to 1 over a solar wavelength range of 0.3 µm to 3 µm;
      wherein the polymer is selected from the group consisting of polymethyl methacrylate (PMMA), polyethylene terephthalate (PET), a 4-methyl-1-pentene polymer, a 4-methyl-1-pentene copolymer, and polyvinyl fluoride; and
      wherein the dielectric particles comprise silicon dioxide ($SiO_2$);
   b. transferring heat from the body to the selective radiative cooling structure; and
   c. radiating heat from the selectively emissive layer of the selective radiative cooling structure.

2. The method of 1, wherein the body is a solar panel, the roof or window of an automobile, the roof or window of a building, or a cold storage structure for energy, food, oil or other commodity.

3. The method of claim 1, wherein the body is a passive thermosiphon or an active channel array and wherein a heat transfer fluid circulates inside the body.

4. The method of claim 1, wherein the selective radiative cooling structure is characterized by an average emissivity ranging from 0.6 to 1.0 over the wavelength range 7 µm to 13 µm.

5. The method of claim 1, wherein the selective radiative cooling structure is characterized by an average emissivity ranging from 0.5 to 1.0 over the wavelength range 7 µm to 13 µm.

6. The method of claim 1, wherein the radiative cooling structure is in the form of a sheet.

7. The method of claim 1, wherein the selective radiative cooling structure further comprises a protective film that is solar transparent and weather-resistant.

8. The method of claim 1, wherein a barrier layer or a protective layer is provided between the selectively emissive layer and the reflective layer.

9. The method of claim 1, wherein the reflective layer is attached by adhesive to the body.

10. The method of claim 1, wherein a thermally conductive layer is provided between the reflective layer and the surface of the body.

11. The method of claim 1, wherein the selective radiative cooling structure provides a radiative heat flux from 50 $W/m^2$ to 150 $W/m^2$ at a working temperature in the range of −100° C. to 500° C.

12. The method of claim 1, wherein the selective radiative cooling structure provides a radiative heat flux from 50 $W/m^2$ to 150 $W/m^2$ during the daytime, nighttime or both.

13. The method of claim 1, wherein the selective radiative cooling structure is characterized by a solar reflectivity ranging from 0.8 to 1 over the wavelength range 0.3 µm to 3 µm.

14. The method of claim 1, wherein the dielectric particles are characterized by an average size ranging from 3 µm to 15 µm.

15. The method of claim 1, wherein the dielectric particles are characterized by an average size ranging from 4 µm to 10 µm.

16. The method of claim 1, wherein the particles are characterized by an average effective diameter selected from the range of 3 µm to 30 µm.

17. The method of claim 1, wherein the volume percentage of the dielectric particles in the selectively emissive layer is selected from the range of 5% to 15%.

18. The method of claim 1, wherein the polymer and dielectric particles are mixed as a uniform blend.

19. The method of claim 1, wherein the concentration variation of dielectric particles in the polymer is less than 0.4%.

20. The method of claim 1, wherein the selectively emissive layer is characterized by an average thickness from 10 µm to 3 mm.

21. The method of claim 1, wherein the selectively emissive layer is characterized by an average thickness from 5 µm to 500 µm.

22. The method of claim 1, wherein the polymer is selected from the group consisting of polyethylene terephthalate (PET), a 4-methyl-1-pentene polymer, and a 4-methyl-1-pentene copolymer.

23. The method of claim 1, wherein the polymer is selected from the group consisting of a 4-methyl-1-pentene polymer, and a 4-methyl-1-pentene copolymer.

24. The method of claim 1, wherein the polymer is a 4-methyl-1-pentene copolymer.

25. The method of claim 1, wherein the polymer is a copolymer of poly(4-methyl-1 pentene) with α-olefins selected from the group consisting of 1-pentene, 1-hexene and 1-octene.

26. The method of claim 1, wherein the polymer is polyvinyl fluoride.

27. The method of claim 1, wherein the dielectric particles are silica.

\* \* \* \* \*